(12) United States Patent
Cheng et al.

(10) Patent No.: US 9,233,840 B2
(45) Date of Patent: Jan. 12, 2016

(54) METHOD FOR IMPROVING SELF-ASSEMBLED POLYMER FEATURES

(75) Inventors: Joy Cheng, San Jose, CA (US); Hayato Namai, San Jose, CA (US); Daniel P. Sanders, San Jose, CA (US)

(73) Assignees: International Business Machines Corporation, Armonk, NY (US); JSR Corporation, Tokyo (JP)

( * ) Notice: Subject to any disclaimer, the term of this patent is extended or adjusted under 35 U.S.C. 154(b) by 835 days.

(21) Appl. No.: 12/913,835

(22) Filed: Oct. 28, 2010

(65) Prior Publication Data

US 2012/0103935 A1    May 3, 2012

(51) Int. Cl.
| | | |
|---|---|---|
| *B44C 1/22* | (2006.01) | |
| *C03C 15/00* | (2006.01) | |
| *C03C 25/68* | (2006.01) | |
| *C23F 1/00* | (2006.01) | |
| *B81C 1/00* | (2006.01) | |
| *H01L 21/033* | (2006.01) | |
| *H01L 21/027* | (2006.01) | |

(52) U.S. Cl.
CPC ........ *B81C 1/00031* (2013.01); *H01L 21/0271* (2013.01); *H01L 21/0337* (2013.01); *H01L 21/0338* (2013.01); *B81C 2201/0149* (2013.01)

(58) Field of Classification Search
CPC ................... H01L 21/30604; H01L 21/30625; H01L 21/3063; H01L 21/3065; H01L 21/3085; H01L 21/3086; H01L 21/3088
USPC ......................................... 216/37, 38, 46, 55
See application file for complete search history.

(56) References Cited

U.S. PATENT DOCUMENTS

| | | |
|---|---|---|
| 5,310,580 A | 5/1994 | O'Sullivan et al. |
| 6,383,952 B1 | 5/2002 | Subramanian et al. |
| 6,416,933 B1 | 7/2002 | Singh et al. |
| 6,492,075 B1 | 12/2002 | Templeton et al. |
| 6,566,280 B1 | 5/2003 | Meagley et al. |
| 6,753,117 B2 | 6/2004 | Lu |
| 7,189,499 B2 | 3/2007 | Sugeta et al. |
| 7,235,345 B2 | 6/2007 | Sugeta et al. |
| 7,651,735 B2 | 1/2010 | Cheng et al. |

(Continued)

OTHER PUBLICATIONS

Notice of Allowance (Mail Date Nov. 9, 2010) for U.S. Appl. No. 12/036,091, filed Feb. 22, 2008.

(Continued)

*Primary Examiner* — Binh X Tran
*Assistant Examiner* — Thomas Pham
(74) *Attorney, Agent, or Firm* — Schmeiser, Olsen & Watts, LLP

(57) ABSTRACT

A method for processing a structure. The structure is formed and includes a substrate, a substructure having a sidewall and disposed on the substrate, a first polymer structure disposed on the substrate, and a second polymer structure disposed on the substrate such that the first polymer structure is disposed between the sidewall and the second polymer structure. An aspect ratio of the first polymer structure, the second polymer structure, or both is reduced in a reducing step. One polymer structure (i.e., the first polymer structure or the second polymer structure) is selectively removed from the structure such that a remaining polymer structure (i.e., the second polymer structure or the first polymer structure) remains disposed on the external surface of the substrate after the one polymer structure has been selectively removed, wherein the aspect ratio of the remaining polymer structure was reduced in the reducing step.

22 Claims, 21 Drawing Sheets

(56) References Cited

U.S. PATENT DOCUMENTS

| | | | |
|---|---|---|---|
| 7,906,031 B2* | 3/2011 | Cheng et al. | 216/41 |
| 2003/0027080 A1 | 2/2003 | Lu | |
| 2003/0091752 A1 | 5/2003 | Nealey et al. | |
| 2006/0003601 A1 | 1/2006 | Sugeta et al. | |
| 2006/0063077 A1 | 3/2006 | Hata et al. | |
| 2006/0134556 A1 | 6/2006 | Nealey et al. | |
| 2006/0276043 A1* | 12/2006 | Johnson et al. | 438/717 |
| 2006/0281266 A1 | 12/2006 | Wells | |
| 2007/0224819 A1 | 9/2007 | Sandhu | |
| 2008/0193658 A1 | 8/2008 | Millward | |
| 2008/0274413 A1 | 11/2008 | Millward | |
| 2008/0299353 A1 | 12/2008 | Stoykovich et al. | |
| 2009/0017628 A1* | 1/2009 | Kim et al. | 438/700 |
| 2009/0107950 A1 | 4/2009 | Cheng et al. | |
| 2009/0136867 A1* | 5/2009 | Zampini et al. | 430/270.1 |
| 2009/0179001 A1 | 7/2009 | Cheng et al. | |
| 2009/0182093 A1 | 7/2009 | Cheng et al. | |
| 2009/0209109 A1* | 8/2009 | Yaegashi et al. | 438/736 |
| 2009/0212016 A1 | 8/2009 | Cheng et al. | |
| 2009/0214823 A1 | 8/2009 | Cheng et al. | |
| 2009/0233236 A1 | 9/2009 | Black et al. | |
| 2009/0263631 A1* | 10/2009 | Sakamoto et al. | 428/195.1 |
| 2009/0286936 A1* | 11/2009 | Ogata et al. | 525/328.8 |
| 2009/0305173 A1 | 12/2009 | Xiao et al. | |
| 2009/0317644 A1* | 12/2009 | Heller et al. | 428/461 |
| 2010/0009132 A1 | 1/2010 | Cheng et al. | |
| 2011/0244688 A1* | 10/2011 | Ohsawa et al. | 438/702 |

OTHER PUBLICATIONS

Abe et al., "Contact Hole Shrink Process with Novel Chemical Shrink Materials," Proceedings of SPIE, 2005, vol. 5753, pp. 206-213.

Freer et al., "Oriented Mesoporous Organosilicate Thin Films," Nano Letters, 2005, vol. 5, No. 10, pp. 2014-2018.

Hah et al., "In-Line Chemical Shrink for 70 nm Contact Holes by Electrostatic Self-Assembly," SPIE 2005, pp. 1-18.

Kim et al., "Analytical Study on Small Contact Hole Process for Sub-65 nm Node Generation," J. Vac. Sci. Technology B 22(6), Nov./Dec. 2004, pp. L38-L43.

Park et al., "Controlled Ordering of Block Copolymer Thin Films by the Addition of Hydrophilic Nanoparticles," American Chemical Society, 2007, 40, pp. 8119-8124.

Terai et al., "Newly Developed RELACS Materials and Process for 65 nm Nodes," Proc. of SPIE, 2006, vol. 6153, pp. 61532I-1-8.

Wallace et al., "Optimization of Resist Shrink Techniques for Contact Hole and Metal Trench ArF Lithography at the 90nm Technology Node," Proc. of SPIE, 2004, vol. 5376, pp. 238-244.

Stoykovich et al., "Directed Assembly of Block-Copolymer Blends into Nonregular Device-Oriented Structures" Science vol. 308, Jun. 2005, pp. 1442-1446.

Black et al., "Polymer Self-Assembly in Semiconductor Microelectronics", IBM J. Res. & Dev., vol. 51, No. 5, Sept 2007, pp. 605-633.

Kailas et al., "Multitechnique Characterization of Thin Films of Immiscible Polymer Systems: PS-b PMMA diblock copolymers and PS-PMMA symmetric blends" ,Surf. Interface Anal. Feb 2005; 37: pp. 435-443.

Harris et al., Surface Morphology of Annealed Polystyrene and Poly(methyl methacrylate) Thin Film Blends and Bilayers; Macromolecules 2003, 36. pp. 3307-3314.

U.S. Appl. No. 12/036,091, filed Feb. 22, 2008, First Named Inventor Joy Cheng.

U.S. Appl. No. 12/058,006, filed Mar. 28, 2008, First Named Inventor Joy Cheng.

* cited by examiner

METHOD FOR IMPROVING SELF-ASSEMBLED POLYMER FEATURES

FIELD OF THE INVENTION

The invention relates to a method for improving self-assembled polymer features.

BACKGROUND OF THE INVENTION

Smaller critical dimension (CD) allows denser circuitry to be created and therefore reduces the overall production cost of microelectronic devices. However, there exists a need for a high throughput method to cost effectively pattern features with dimensions or pitches smaller than those which can be fabricated by optical lithography. Self-segregating polymer blends provide a route to generate self-assembled polymer features next to existing topographical features on a wafer. However, such self-assembled polymer features may become distorted or even collapse during their formation or further processing of the resultant polymer pattern. Thus, there is a need to improve the self-assembled polymer features resulting from self-segregated polymer blends in order to retain pattern fidelity.

SUMMARY OF THE INVENTION

The present invention provides a method for processing structures, said method comprising:

forming a structural configuration, said structural configuration comprising a substrate, a substructure having a sidewall and disposed on an external surface of the substrate, a first polymer structure disposed on the external surface of the substrate and in direct mechanical contact with the sidewall, and a second polymer structure disposed on the external surface of the substrate and in direct mechanical contact with the first polymer structure such that the first polymer structure is disposed between the sidewall and the second polymer structure, said first polymer structure comprising a first polymer, said second polymer structure comprising a second polymer;

reducing an aspect ratio of each polymer structure of at least one polymer structure with respect to the external surface of the substrate, said reducing comprising removing an upper portion furthest from the substrate of each polymer structure of the at least one polymer structure, said at least one polymer structure selected from the group consisting of the first polymer structure, the second polymer structure, and both the first polymer structure and the second polymer structure; and selectively removing one polymer structure from the structural configuration such that a remaining polymer structure remains disposed on the external surface of the substrate after the one polymer structure has been selectively removed, said reducing having reduced the aspect ratio of the remaining polymer structure, wherein either the selectively removed one polymer structure is the first polymer structure and the remaining polymer structure is the second polymer structure or the selectively removed one polymer structure is the second polymer structure and the remaining polymer structure is the first polymer structure.

DETAILED DESCRIPTION OF THE INVENTION

Figure 1A:
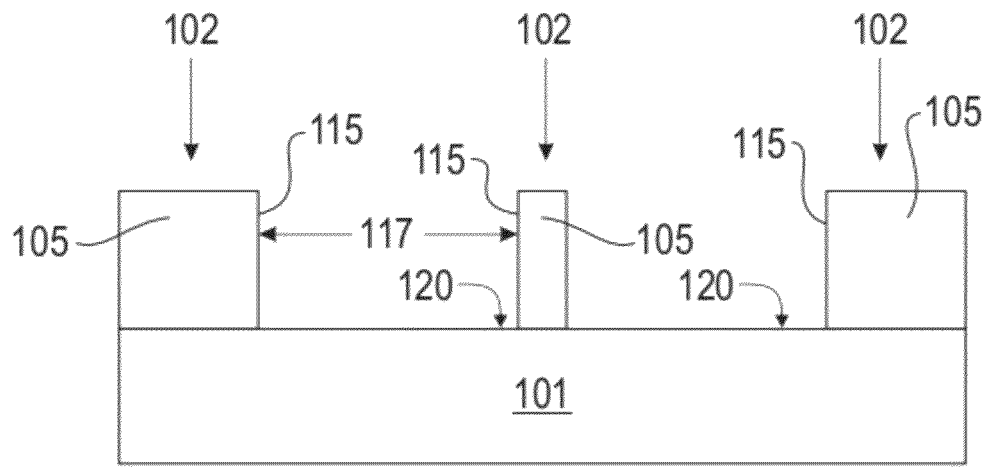
FIG. 1A is an illustration of a substrate with a substructure disposed on a surface of the substrate, in accordance with embodiments of the present invention.

Although certain embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., and are disclosed simply as examples of embodiments. The features and advantages of the present invention are illustrated in detail in the accompanying drawings, wherein like reference numerals refer to like elements throughout the drawings. Although the drawings are intended to illustrate the present invention, the drawings are not necessarily drawn to scale.

The detailed description of the present invention is organized into the following sections:
1. Aligning Polymer Films and Related Structures;
2. Improving Self-Assembled Polymer Features 1. Aligning Polymer Films and Related Structures The following are definitions:

A monomer as used herein is a molecule that can undergo polymerization which contributes constitutional units to the essential structure of a macromolecule, an oligomer, a block, a chain, and the like.

A polymer as used herein is a macromolecule comprising multiple repeating smaller units or molecules (monomers) derived, actually or conceptually, from smaller units or molecules, bonded together covalently or otherwise. The polymer may be natural or synthetic.

A copolymer as used herein is a polymer derived from more than one species of monomer.

A block copolymer as used herein is a copolymer that comprises more than one species of monomer, wherein the monomers are present in blocks. Each block of the monomer comprises repeating sequences of the monomer. A formula (1) representative of a block copolymer is shown below:

$$-(A)_a\text{-}(B)_b\text{---}(C)_c\text{-}(D)_d\text{-} \quad (1)$$

wherein A, B, C, and D represent monomer units and the subscripts "a", "b", "c", and "d", represent the number of repeating units of A, B, C, and D respectively. The above referenced representative formula is not meant to limit the structure of the block copolymer used in an embodiment of the present invention. The aforementioned monomers of the copolymer may be used individually and in combinations thereof in accordance with the method of the present invention.

A di-block copolymer has blocks of two different polymers. A formula (2) representative of a di-block copolymer is shown below:

$$-(A)_m\text{-}(B)_n\text{---} \quad (2)$$

where subscripts "m" and "n" represent the number of repeating units of A and B, respectively. The notation for a di-block copolymer may be abbreviated as A-b-B, where A represents the polymer of the first block, B represents the polymer of the second block, and -b- denotes that it is a di-block copolymer of blocks of A and B. For example, PS-b-PMMA represents a di-block copolymer of polystyrene (PS) and polymethylmethacrylate (PMMA).

A substrate, as used herein, is a physical body (e.g., a layer or a laminate, a material, and the like) onto which materials (such as polymers, polymeric materials, metals, oxides, dielectrics, etc.) may be deposited or adhered.

A nanoparticle as used herein is a particle on the order of 1 nanometer (nm) to 100 nm in dimension. Examples of the structure may include but are not limited to nanorods, nanosheets, nanospheres, nanocylinders, nanocubes, nanoparticles, nanograins, nanofilaments, nanolamellae, and the like having solid composition and a minimal structural dimension in a range from about 1 nm to about 100 nm.

The substrates described herein may include semiconducting materials, insulating materials, conductive materials, or any combination thereof, including multilayered structures. Thus, for example, a substrate may comprise a semiconducting material such as Si, SiGe, SiGeC, SiC, GaAs, InAs, InP and other III/V or II/VI compound semiconductors. A substrate may comprise, for example, a silicon wafer or process wafer such as that produced in various steps of a semiconductor manufacturing process, such as an integrated semiconductor wafer. A substrate may comprise a layered substrate such as, for example, Si/SiGe, Si/SiC, silicon-on-insulators (SOIs) or silicon germanium-on-insulators (SGOIs). A substrate may comprise layers such as a dielectric layer, a barrier layer for copper such as SiC, a metal layer such as copper, a hafnium dioxide layer, a silicon layer, a silicon oxide layer, the like, or combinations thereof. A substrate may comprise an insulating material such as an organic insulator, an inorganic insulator or a combination thereof including multilayers. In particular, a substrate may comprise an organic insulating material such as an amorphous carbon-rich material formed via a spin-on or chemical vapor deposition process. A substrate may comprise an organic or inorganic anti-reflection coating. In particular, the anti-reflection coating may be comprised of organic polymers, inorganic polymers (e.g., silicon containing), or inorganic materials (e.g., silicon nitride). A substrate may comprise a conductive material, for example, polycrystalline silicon (polySi), an elemental metal, alloys of elemental metals, a metal silicide, a metal nitride, or combinations thereof, including multilayers. A substrate may comprise ion implanted areas, such as ion implanted source/drain areas having P-type or N-type diffusions active to the surface of the substrate.

In some embodiments, a substrate may include a combination of a semiconducting material and an insulating material, a combination of a semiconducting material and a conductive material or a combination of a semiconducting material, an insulating material and a conductive material. An example of a substrate that includes a combination of the above is an interconnect structure.

FIG. 1A is an illustration of a substrate 101 with a substructure 105 disposed on a surface of the substrate 101. The substructure 105 may comprise at least one feature 102, having at least one sidewall 115 and an adjoining bottom 120. The at least one feature 102 may comprise a plurality of features, for example. The bottom 120 may be essentially perpendicular to the sidewall 115. The bottom 120 may be defined by an exposed portion of the surface of the substrate 101. The bottom 120 may comprise a material which is the same or different from material comprising the at least one sidewall 115. The structures herein, in addition to at least one sidewall and a bottom, may comprise, for example, holes, trenches, vias, posts, lines, or a combination of these. The at least one sidewall 115 may comprise two sidewalls 115 separated by a distance 117. The substructure 105 may comprise the summation of all the material in a layer comprising the topography and may be continuous or non-continuous as necessary to form patterns that include holes, posts, islands, lines, and trenches, etc., any of which may be isolated or nested.

The substructure 105 may be integral with the substrate 101, for example, the substrate 101 surface may comprise a plurality of holes etched into a substrate surface by a method such as by reactive ion etching (RIE). The substructure 105 may be formed on the substrate surface by a process such as patterning a photoresist, patterning a polymer, patterning an inorganic material, etching, chemical vapor deposition, sputtering, atomic layer deposition, coating, chemical attachment, or a combinations of these. Chemical attachment may comprise the use of chemical shrink materials to deposit layers onto the substrate.

Figure 1B:
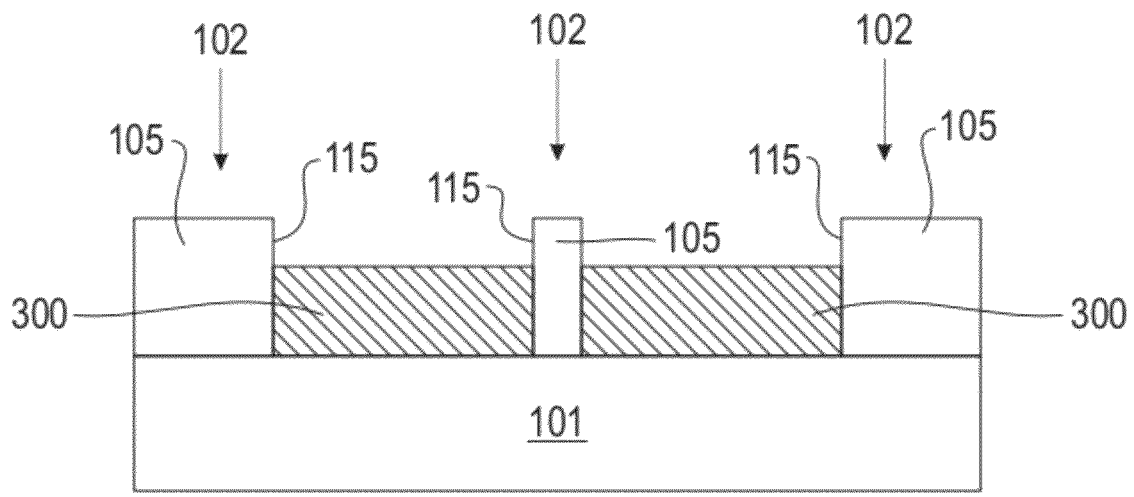
FIG. 1B is an illustration of the substrate and substructure of FIG. 1A after applying a solution to the substructure, in accordance with embodiments of the present invention.

FIG. 1B is an illustration of the substrate 101 and substructure 105 of FIG. 1A after applying a solution 300 to the substructure 105. The solution 300 may comprise two or more immiscible polymers, where the two or more immiscible polymers may comprise a first polymer and a second polymer. The first polymer may have a chemical affinity for the material of the sidewalls 115 which is higher than the chemical affinity of the second polymer for the sidewalls 115. Applying the solution may for a film having a thickness in a range from about 5 nanometers (nm) to about 500 nm.

Additional materials (such as a RELACS®-type material) may be used to modify the substructure, where additional layers may be deposited onto the sidewalls to adjust the chemical properties of the sidewall such that they will have an increased or decreased affinity for the two or more immiscible polymers. For example, a polar chemical shrink material may be used to increase the polarity of the sidewalls to favor interactions with the more polar component of the two or more immiscible polymers. Also, a more hydrophobic shrink material may be deposited on the sidewalls to favor interactions with a non-polar component of the two or more polymers. In addition, shrink materials having functional groups may be deposited on the sidewalls to promote affinity for polymer that will have specific interactions with them (i.e., ionic bonds, hydrogen bonding, etc.) in order to control which of the two or more polymers will sequester next to the at least one sidewall.

The term "immiscible" as used herein refers to the at least two polymers in the polymer blend being incompatible enough to drive phase segregation under certain process conditions. The immiscibility of the polymers in the polymer blends may depend on the composition as well as the film forming process of the polymer blends. The ratio of the polymers, molecular weight of the individual polymers in the blend, and the presence of other additional components in the blend may adjust the compatibility of the polymers in the polymer blend. Temperature, coating conditions, and substrate surface properties may also affect the segregation of the polymers in the substrate topography. As used herein, an "immiscible polymer" is defined as a polymer from a polymer blend composition which segregates in the topography on a properly prepared topographical substrate under proper process conditions.

Examples of suitable polymers for the two or more immiscible polymers include: cellulose, poly(acrylamide), polyethyleneimine, poly(acrylic acid), poly(2-ethyl-2-oxazoline), poly(ethyleneoxide), and poly(vinyl alcohol), novolac resins, cresol resins, poly(hydroxystyrene), poly(acrylic acid), poly(styrene sulfonic acid), poly(vinyl phosphoric acid), poly(vinyl sulfonic acid), poly(2-sulfoethyl methacrylate), poly(2-sulfopropyldimethyl-3-methacrylamide), poly(1,1,1-trifluoro-2-(trifluoromethyl)-2-hydroxy-pentan-4-yl methacrylate), fluoroalcohol-based polymers, poly(2-ethyl-trifluoromethanesulfonamide methacrylate), acidic sulfonamide polymers, poly(styrene), poly(hydroxyadamantyl methacrylate), poly(isobornyl methacrylate), poly(phenyl methacrylate), poly(vinyl naphthalene), polysiloxanes, polymethylsilsesquioxanes, polycarbosilanes, poly(vinyl ferrocene), poly(acylonitrile), poly(caprolactone), poly(lactide), poly(methyl methacrylate), poly(2-hydroxyethyl methacrylate), poly(gamma-butyrolactone methacrylate), poly(tetrahydrofuranyl methacrylate), poly(tetrahydropyranyl methacrylate), poly(allyl amine), poly(4-aminostyrene), poly(2-dimethylaminoethyl methacrylate), polyethyleneneimine, poly(N-methylvinylamine), poly(vinyl pyridine), poly(isoprene), poly(butadiene), poly(norbornene), poly(ethylene), poly(propylene), poly(1,1,1-trifluoro-2-(trifluoromethyl)-2-hydroxy-pentan-4-yl methacrylate), fluoroalcohol-based polymers, poly(2-ethyl-trifluoromethanesulfonamide methacrylate), acidic fluorosulfonamide polymers, poly(2,2,2-trifluoroethyl methacrylate), poly(hexafluoroisopropyl methacrylate), poly(2,3,4,5,6-pentafluorostyrene), and substituted derivatives thereof. The two or more immiscible polymers may be selected such that each polymer is immiscible with each other polymer in the blend.

The solution 300 comprising the first and second polymers may further comprise a third polymer. Examples of a third polymer include, homopolymers, block copolymers, graft copolymers, and random copolymers For example, if a polymer blend is made from immiscible polymer A and immiscible polymer B, then a A-b-B, A-grafted-B, or A-ran-B can be used to adjust the interfacial energy between domains of polymer A and domains of polymer B, where A-grafted-B denotes a grafted copolymer of polymer A and polymer B, and A-ran-B denotes a random block copolymer of polymer A and polymer B. For example, adding A-b-B or A-grafted-B would reduce the interfacial energy between polymer A and polymer B, and, therefore, affect the segregation behavior of the polymer blends. In addition, the lateral dimension of the polymer domains formed after segregation may depend on the ratio of polymer A and polymer B and the additional components in the blend.

The solution 300 may comprise one or more additional components, such as photosensitive acid generators, surfactants, base quenchers, nanoparticles, metal compounds, inorganic compounds, and solvents. The nanoparticles may comprise materials such as inorganic oxides (alumina, titania, halfnia, etc.), inorganic nitrides, inorganic carbide, or metals (gold, etc.). Examples of inorganic compounds include organometallic compounds, such as ferrocene, which may impart high oxygen etch resistance to the polymer domain in which the metal compound are dissolved. Examples of inorganic compounds include organosilicates or organosilicon/organogermanium compounds, which may readily form etch resistant glasses during oxygen reactive ion etching (RIE) processes.

Surfactants described herein may be used to improve coating uniformity, and may include ionic, non-ionic, monomeric, oligomeric, and polymeric species, or combinations thereof. Examples of possible surfactants include fluorine-containing surfactants such as the FLUORAD® series available from 3M Company in St. Paul, Minn., and siloxane-containing surfactants such as the SILWET® series available from Union Carbide Corporation in Danbury, Conn.

Solvents described herein may be used to dissolve the components in the solution 300, so that the solution 300 may be applied evenly on the substrate surface to provide a defect-free coating. Some examples of suitable solvents include ethers, glycol ethers, aromatic hydrocarbons, ketones, esters, ethyl lactate, gamma-butyrolactone (GBL), cyclohexanone, ethoxyethylpropionate (EEP), a combination of EEP and GBL, and propylene glycol methyl ether acetate (PGMEA). The embodiments described herein are not limited to the selection of any particular solvent. The solvent for the solution 300 may be chosen such that the solvent does not dissolve the substructure or underlying layers of the substrate.

Base quenchers described herein may comprise aliphatic amines, aromatic amines, carboxylates, hydroxides, or combinations thereof. For example, base quenchers may include: tetra alkyl ammonium hydroxides, cetyltrimethyl ammonium hydroxide, dimethylamino pyridine, 7-diethylamino-4-methyl coumarin (Coumarin 1), tertiary amines, sterically hindered diamine and guanidine bases such as 1,8-bis(dimethylamino)naphthalene (PROTON SPONGE), berberine, or polymeric amines such as in the PLURONIC® or TETRONIC® series commercially available from BASF. The embodiments described herein are not limited to any specific selection of these expedients.

The photosensitive acid generators (PAG) described herein are capable of producing or generating an amount of acid (such as 1 mole of acid per mole of PAG, for example) upon exposure to a dose of electromagnetic radiation, such as visible, ultraviolet (UV) and extreme ultraviolet (EUV), for example. The PAG may comprise, for example, triphenyl sulfonium nonaflate (TPSN), (trifluoro-methylsulfonyloxy)-bicyclo[2.2.1]hept-5-ene-2,3-dicarboximide (MDT), N-hydroxy-naphthalimide dodecane sulfonate (DDSN), onium salts, aromatic diazonium salts, sulfonium salts, diaryliodonium salts, sulfonic acid esters of N-hydroxyamides, imides, or combinations thereof.

The solution 300 may be applied by spin coating the solution 300 onto the substrate 101 at a spin speed in a range from about 1 rpm to about 10,000 rpm. The solution 300 may be spin coated at room temperature without a post-drying process. The applied solution 300 may be thermally annealed, for example, at a temperature above the glass transition temperature of the first polymer and above the glass transition temperature of the second polymer. The applied solution 300 may be vapor annealed, after applying the solution 300 to the substrate 101, such as by annealing the applied solution 300 under organic solvent vapor at or above room temperature (about 25° C.) from about 10 hours to about 15 hours, for example.

The spin coating process used is not meant to limit the type of processes that may be used when applying the solution to the substructure 105. Other processes such as dip-coating and spray-coating, a combination thereof, or any other process which provides a means for applying the solution 300 to the substructure 105 may be employed.

Figure 1C:
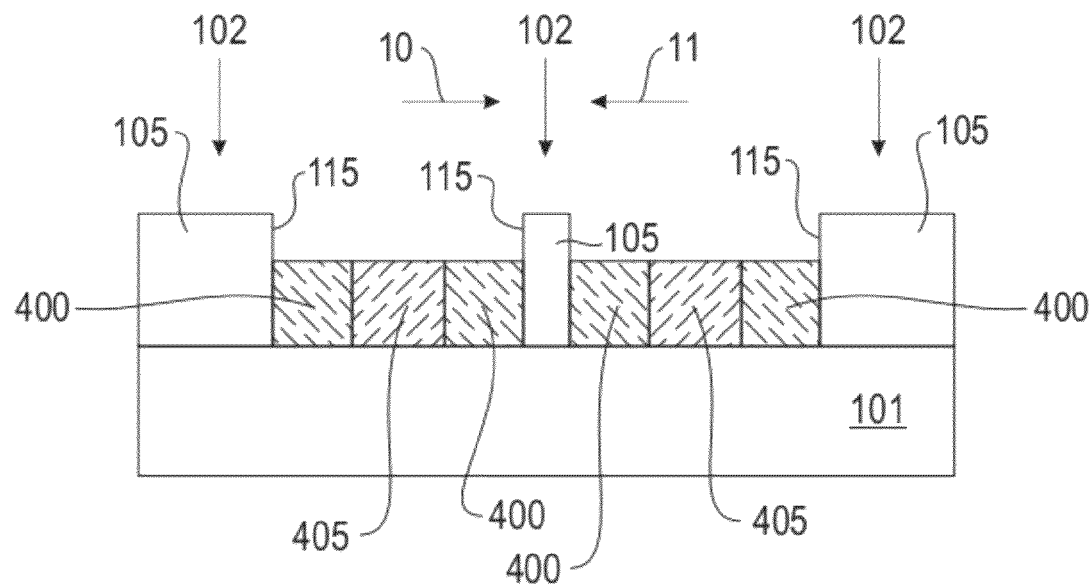
FIG. 1C is an illustration of the solution in FIG. 1B after segregating the first polymer from the second polymer, in accordance with embodiments of the present invention.

FIG. 1C is an illustration of the solution in FIG. 1B after segregating the first polymer 400 from the second polymer 405. The first polymer 400 selectively migrates to the at least one sidewall 115 of the at least one feature 102, resulting in the first polymer 400 being disposed between the sidewall 115 and the second polymer 405. The second polymer 405 may be disposed in a central position between sidewalls of two adjacent portions of the substructure 105, and separated from each sidewall 115 by a layer of the first polymer 400. The first polymer 400 may migrate towards the at least one sidewall 115 due to having a higher affinity for the at least one sidewall 115 than does the second polymer 405. The second polymer 405 may be excluded from the at least one sidewall 115 by the first polymer 400 due to the lower affinity of the second polymer 405 for the at least one sidewall 115. For example, the at least one sidewall may comprise a hydrophilic material and the first polymer may comprise a hydrophilic polymer, where the second polymer may comprise a hydrophobic polymer. In such a case, the first polymer would have a much stronger selective chemical affinity for the at least one sidewall than would the second polymer. In the example illustrated in FIG. 1C, neither the first polymer 400 nor the second polymer 405 have a higher selective chemical affinity for the material comprising the bottom 120 of the feature 102. Thus in FIG. 1C, the first polymer 400 and the second polymer 405 are distributed in a polymer segregation pattern in which the first polymer 400 and the second polymer 405 are distributed in a direction 10 or 11 that is perpendicular to each sidewall of the at least one sidewall 115.

Figure 1D:
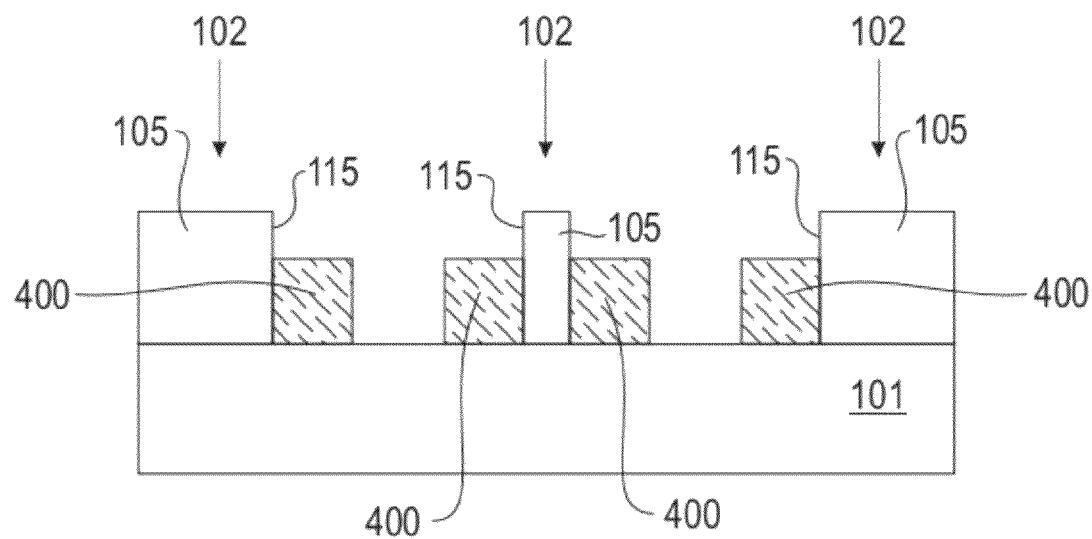
FIG. 1D is an illustration of FIG. 1C after selectively removing the second polymer structures, in accordance with embodiments of the present invention.

FIG. 1D is an illustration of FIG. 1C after selectively removing the structures comprising the second polymer 405, resulting in forming structures on the substrate 101, where the structures comprise the substructure 105 and the first polymer 400 remaining on the surface.

Selective removal of substructure 105, the structure comprising first polymer 400, or the structure comprising second polymer 405 may comprise using a process such as developing (such as developing in aqueous base developer), dissolving in solvent, and plasma etching, where the selected process may selectively remove the targeted structures and leave others remaining. In the example of FIG. 1D, the second polymer 405 of FIG. 1C has been selectively removed, resulting in forming structures comprising the first polymer 400 and the substructure 105 on the substrate 101, and resulting in the first immiscible polymer remaining against the at least one sidewall 115 and reducing an effective dimension of the feature (e.g., distance 117—see FIG. 1A). A dimension of the feature may comprise the lateral width (such as a spacing between two or more sidewalls), diameter (such as in a case where the feature is a cylindrical hole), the depth of a hole, or a combination of these. Where polymer remains disposed against a sidewall 115, for example, the effective distance 117 between the sidewalls has been reduced by the thicknesses of the polymer layers formed. Where the feature comprises a hole, the effective diameter of the hole may be reduced in a similar manner.

Figure 1E:
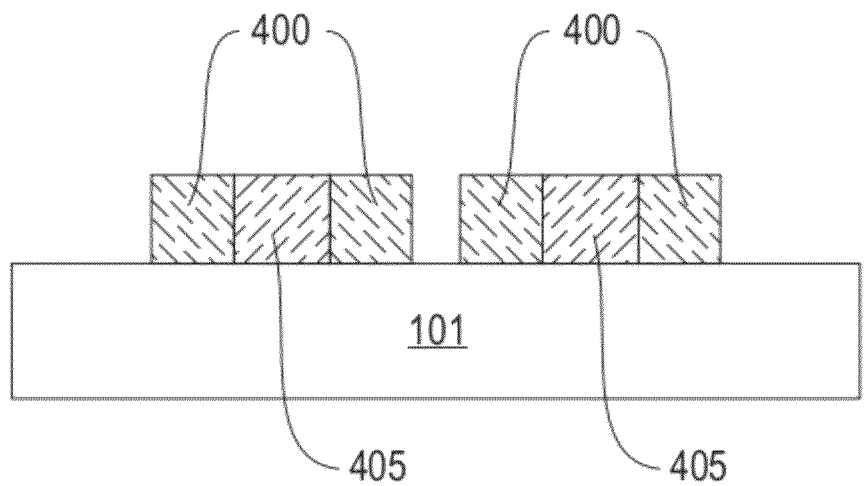
FIG. 1E is an illustration of FIG. 1C, where the substructures have been removed, in accordance with embodiments of the present invention.

FIG. 1E is an illustration of FIG. 1C, where the substructure 105 has been removed. Removal of the substructure 105 results in forming structures comprising a pattern of spaces 410, and subfeatures, where the subfeatures include structures that comprise the first polymer 400 and the second polymer 405 remaining on the surface.

Figure 1F:
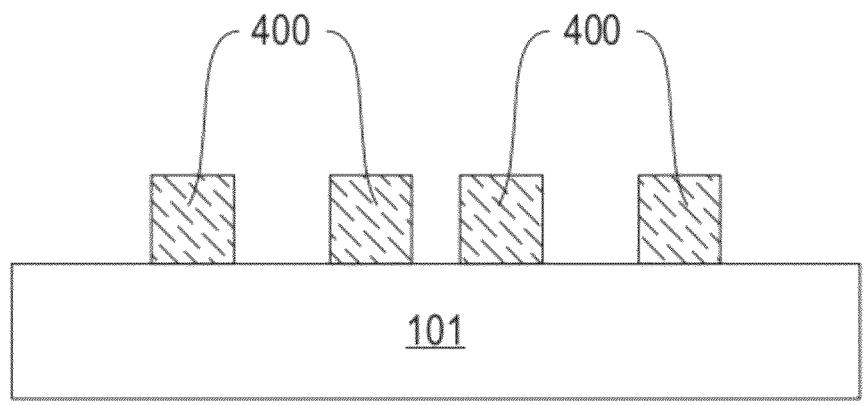
FIG. 1F is an illustration of FIG. 1E, where the second polymer structures have been removed, in accordance with embodiments of the present invention.

FIG. 1F is an illustration of FIG. 1E, where the structures comprising the second polymer 405 have been removed, resulting in structures remaining on the substrate, where the remaining structures comprise the first polymer 400. Alternatively, FIG. 1F can be considered to be an illustration of FIG. 1D, where the substructure 105 has been removed, resulting in structures remaining on the substrate, where the structures comprise the first polymer 400.

Figure 1G:
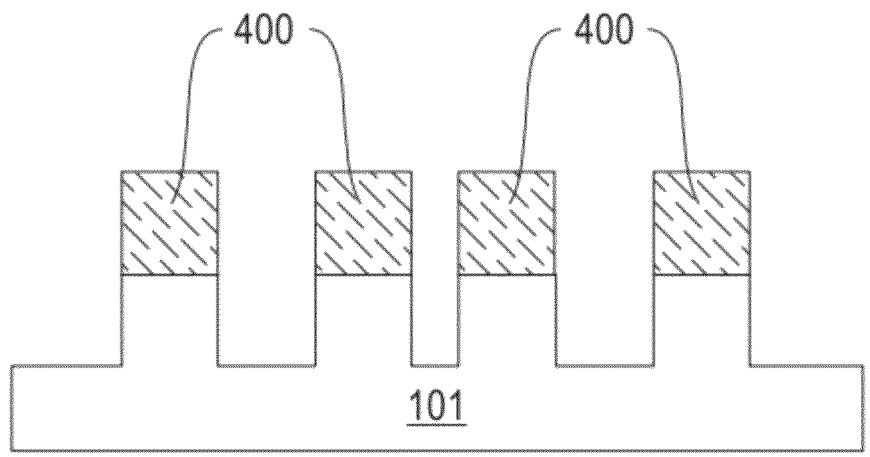
FIG. 1G is an illustration of FIG. 1F after transferring the pattern of first polymer structures to the substrate, in accordance with embodiments of the present invention.
Figure 1H:
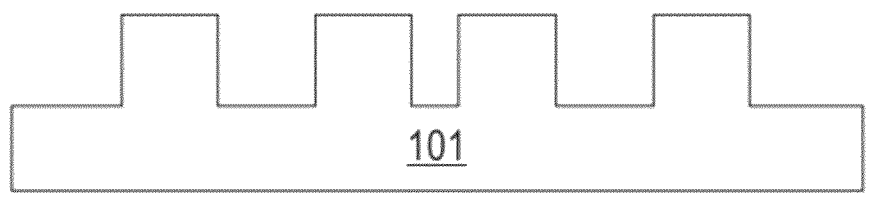
FIG. 1H is an illustration of FIG. 1G after removal of the first polymer structures, in accordance with embodiments of the present invention.

FIG. 1G is an illustration of FIG. 1F after transferring the pattern of the structures comprising the first polymer 400 to the substrate 101. FIG. 1H is an illustration of FIG. 1G after removal of the structures comprising the first polymer 400 to leave the patterned substrate 101 remaining.

Figure 2A:
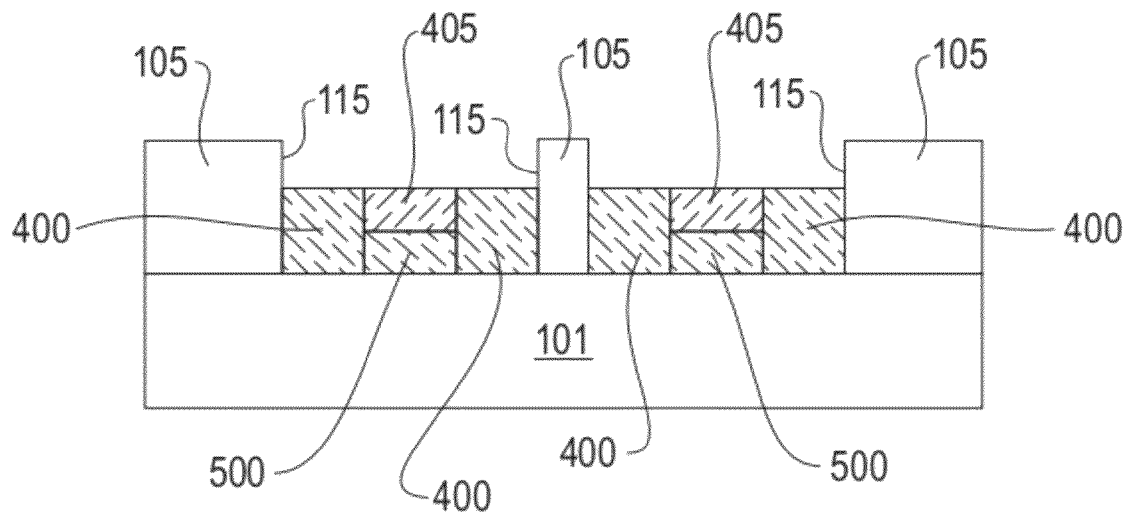
FIG. 2A is an illustration of the example of FIG. 1B after segregating the first polymer from the second polymer to form polymer structures, in accordance with embodiments of the present invention.

FIG. 2A is an illustration of the example of FIG. 1B after segregating the first polymer 400 from the second polymer 405, where the first polymer 400 has a higher affinity for the material comprising the bottom 120 than does the second polymer 405, resulting in a first portion 500 of said first polymer 400 being disposed between the second polymer 405 and the bottom 120. In FIG. 2A, the bottom material may comprise the same material as the at least one sidewall or may comprise a material which is sufficiently chemically similar such that the first polymer has a higher affinity for the bottom than does the second polymer. For example, the at least one sidewall and the bottom may each comprise hydrophobic materials, where the first polymer comprises a hydrophobic polymer and the second polymer comprises a hydrophilic polymer.

Figure 2B:
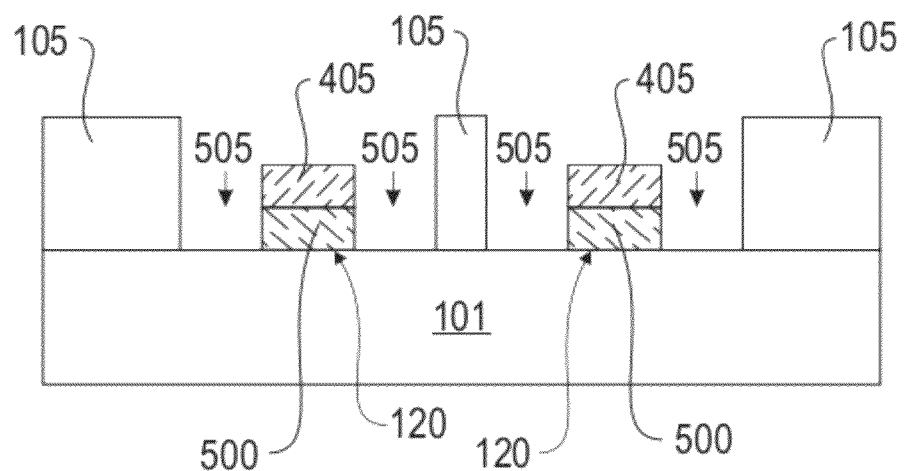
FIG. 2B is an illustration of example of FIG. 2A after removing a second portion of said structure comprising the first polymer, in accordance with embodiments of the present invention.

FIG. 2B is an illustration of an example of FIG. 2A after removing a second portion of said first polymer 400, resulting in a structure remaining on the surface of the substrate, where the structure comprises the substructure 105, the second polymer 405, and the first portion 500 of the first polymer 400 disposed between the second polymer 405 and the bottom 120. Removing selectively the first polymer 400 results in formation of spaces 505 between the at least one sidewall 115 and the second polymer 405 remaining.

Figure 3:
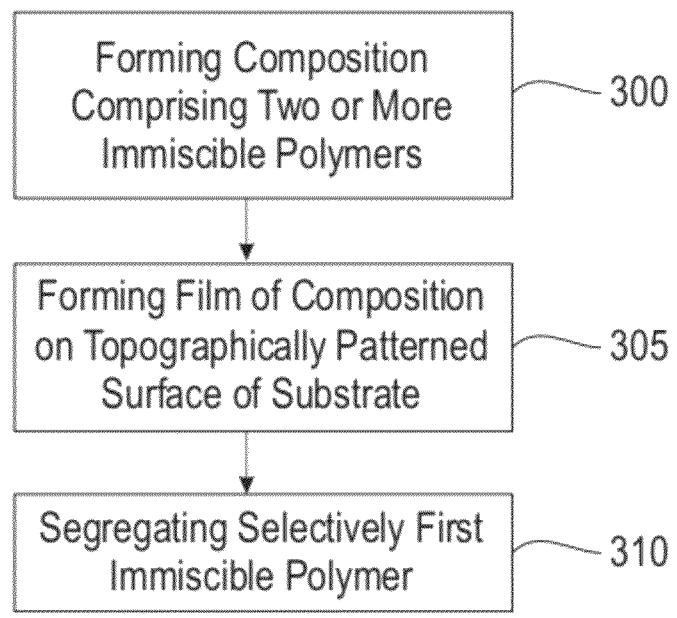
FIG. 3 is a flow chart illustrating a material alignment method, in accordance with embodiments of the present invention.

FIG. 3 is a flow chart illustrating a method. Step 300 comprises forming a composition comprising two or more immiscible polymers. The two or more immiscible polymers may comprise a first immiscible polymer and a second immiscible polymer, such as those described above. The composition may comprise a third material blended with the two or more immiscible polymers. The third material may be miscible with the first polymer, the second polymer, both the first polymer and the second polymer, or neither the first polymer nor the second polymer. The third material may comprise a polymer having a structure where a first portion of the structure is miscible with the first polymer and a second portion of the structure is miscible with the second polymer. For example, the third material may comprise a block copolymer having polymer blocks miscible with the first polymer, polymer blocks miscible with the second polymer, or a combination of these.

Step 305 comprises forming a film of the composition on a topographically patterned surface of a substrate, where the surface may have a plurality of features disposed thereon, such as the substrates described above having substructures disposed thereon. Each feature of the plurality of features may have at least one sidewall essentially perpendicular to the surface, such as a trench having at least two sidewalls, or a hole having one sidewall, for example. Each feature may be separated from adjacent features by a distance across the substrate surface. Examples of features include holes, posts, islands, lines, and trenches, etc., any of which may be isolated or nested. The at least one sidewall may comprise a first material, where said first immiscible polymer has a selective chemical affinity for the first material which is greater than the selective chemical affinity of the second immiscible polymer for the first material. Step 305 may be implemented in various embodiments such as embodiments discussed supra in conjunction with FIG. 1C.

Step 310 comprises segregating selectively the first immiscible polymer to the at least one sidewall. The segregating of step 310 may occur either during or after the film forming of step 305. The segregating of the first polymer at the at least one sidewall may result in excluding the second polymer from the at least one sidewall by the first polymer due to the high affinity of the first polymer for the material of the sidewall. As the first polymer forms a structure (e.g., a layer or domain) next to the at least one sidewall, the second polymer may be displaced away from the at least one sidewall by the first polymer. This results in the first immiscible polymer forming a first structure conforming to the at least one sidewall, and the second immiscible polymer forming a second structure conforming to the first layer. The first structure may be disposed between the at least one sidewall and the second layer, resulting in the first structure, the second structure and the third material aligning essentially parallel to the at least one sidewall. As the first structure conforms to the at least one side wall, the structure aligns with the at least one sidewall, following the direction of the sidewall. For example, where the sidewall is a sidewall of a hole, the first structure conforms to the sidewall and aligns with and follows the circumference of the sidewall. Likewise, the second layer aligns with and conforms to the direction of the first structure.

A third material dissolved in the first structure or the second structure may be automatically aligned with the structure in which it is dissolved as the structure is formed and aligned. For a third material such as a block copolymer, for example, in which a first portion of its structure (e.g., a first polymer block) is miscible with the first polymer and a second portion of its structure (e.g., a second polymer block) is miscible with the second polymer, the third material may be disposed along the interface between the first structure and the second structure, where each portion of the third material's structure is dissolved in the corresponding structure with which it is miscible. The third material may be used to adjust the interfacial energy between first and second polymers and thus optimize segregation of the first and second polymer in the topography. The third material may be disposed at the bottom surface if it has a higher chemical affinity for the bottom surface than both of the immiscible polymers. If the third material has a lower surface energy than the two immiscible polymers, it may be disposed at the air interface of the resulting film. After forming the film, one or more of the two or more immiscible polymers or the third material may be removed from the film, as described for the polymers above.

The method of FIG. 3 may further comprise annealing the film either after forming the film in step 300 or during forming the film in step 300. Annealing may comprise methods such as thermal annealing, solvent vapor annealing, zone annealing, and combinations thereof.
Annealing may accelerate or otherwise induce the segregation of the two or more polymers.

These embodiments described herein have a number of advantages over conventional processes. For cases where it is desired to shrink the CD of patterned spaces, conventional processes such as thermal reflow, RELACS®, or SAFIER® have detrimental dependencies on pattern geometry (density and pitch), process conditions (baking time and temperature) and/or resist chemistry which limits that the process window of these approaches. The embodiments disclosed herein provide a way to reduce feature dimensions and are less sensitive to the resist chemistry and process conditions. The lateral dimension of the segregated polymer structures may be determined by the ratio of the different polymers used in the composition. Since this ratio is predetermined, the resulting dimensions of the segregated polymer structures may have less dependence on bake temperature and bake time variations or specific resist chemistry.

Processes employing double patterning and sidewall image transfer techniques (e.g., self-aligned double patterning and spacer-based double patterning techniques), when used to create patterns with dimensions and/or pitches smaller than that of an initial pattern produced by optical lithography, are very costly and process intensive. Often, they require multiple patterning, deposition, or etch steps. The polymer blend approach disclosed herein involves primarily spin-casting and baking steps which can be performed by a single track tool. This track-only process would advantageously lower process costs and increase throughput.

The immiscible polymers used in the segregating composition may be selected appropriately for the respective process (i.e., shrink or frequency multiplication). For example, for the process shown in FIG. 1D, the first polymer may have higher affinity for the sidewall than the second polymer. In addition, it is advantageous if the second polymer has a higher etch rate or dissolution rate in developer than the first polymer so that the second polymer can be selectively removed. This may be accomplished, for example, by selecting a second polymer with a high etch rate or dissolution rate in developer or by selecting a first polymer with a lower etch rate or lower dissolution rate in developer. The relative properties of either the first or second polymers may be tuned by incorporating a third material that will co-assemble with one of the polymers. For example, a organosilicate material can be added which would co-assemble with a polymer such as poly(ethylene oxide) and dramatically increase its oxygen plasma etch resistance.

For the method illustrated in FIG. 1E, it is advantageous where the properties of the first and second polymers are such that the second polymer can be easily removed by etching or dissolution in a developer. For the method illustrated in FIG. 1F, the first polymer has a much higher etch resistance than either the second polymer or the material that comprises the substructure 105 (resist, transfer layer, hardmask, etc.) in one embodiment. In one example where the substructure is a photoresist (e.g., a patterned organic photoresist), it is advantageous for the first polymer to contain elements such as silicon and germanium that provide high oxygen etch resistance or if a third material (such as an organosilicate) is co-assembled with the first polymer to provide such high etch resistance.

Many equivalent techniques to engineer the desired properties into the respective segregated polymer domains are known to those skilled in the art and are included in the scope of this invention.

EXAMPLE 1

A solution containing polystyrene (PS, 22 kilograms/more (kg/mole), from polymer source) and polymethylmethacrylate (PMMA, 21 kg/mole from polymer source) and polystyrene-block-polymethylmethacrylate (PS-b-PMMA, 38 kg/mole-36 kg/mole, from polymer source) with a PS:PMMA:PS-b-PMMA weight ratio of 6:3:1 was cast onto a silicon wafer substrate coated with an anti-reflective coating (ARC) with thermally hardened line/space positive photoresist features having a pitch of 240 nm and then baked at 200° C. for 1 minute. PMMA segregated to form lines next to the resist sidewall and PS segregated to the middle of the resist space. PS-b-PMMA resided in the interface between PS and PMMA lines and was used to tune the interfacial energy between PS and PMMA. The sample was etched in an oxygen plasma for 10 seconds to remove the PMMA and showed remaining PS and resist lines with pitch of 120 nm.

EXAMPLE 2

A polymer blend solution containing polystyrene (PS, 22 kg/mole, from polymer source) and polymethylmethacrylate (PMMA, 21 kg/mole from polymer source) and polystyrene-block-polymethylmethacrylate (PS-b-PMMA, 38 kg/mole-36 kg/mole, from polymer source) with a PS:PMMA:PS-b-PMMA weight ratio of 6:3:1 was cast on a substrate with negative e-beam resist (XR1541, hydrogen silsesquioxane from Dow Corning, hydrophilic resist) line/space features with a pitch of 110 nm and resist space from 50 nm to 80 nm. The sample was baked at 200° C. for 1 minute and etched under oxygen plasma for 10 sec. The remaining PS and resist lines demonstrated successful self-segregation in the narrower resist spaces.

EXAMPLE 3

A polymer blend solution of poly (1-(4-hydroxyphenyl) ethyl silsesquioxane-ran-(1-(phenyl)ethyl silsesquioxane)) (poly(HMBS$_{50}$-r-MBS$_{50}$) and poly(1,1,1-trifluoro-2-(trifluoromethyl)-2-hydroxy-pent-4-yl methacrylate) (poly(iPrHFAMA) with weight ratio 1:1 was cast on a substrate with line/space and hole/post features of a standard 193 nm positive resist (AR 1682). The sample was baked at 200° C. for 1 minute, developed in 0.26 N tetramethylammonium hydroxide solution (CD26 developer) for one minute, then rinsed and dried. The poly(iPrHFAMA) was removed by CD26 developer, and poly(HMBS$_{50}$-r-MBS$_{50}$) was left forming lines in between the resist lines and forming dots in between resist dots.

2. Improving Self-Assembled Polymer Features

As described supra in conjunction with Section 1, self-assembled polymer blends provide a route to generate polymer features next to the existing topographical features. This portion of the detailed description (Section 2) of the present invention describes a method and system for improving polymer features on substrates such as, inter alia, the self-assembled polymer features generated according to the methodology of the previous portion (Section 1) of the detailed description of the present invention.

All subject matter in Section 1 applies to Section 2. The structures comprising polymer A (first polymer) and polymer B (second polymer) discussed in Section 2 respectively correspond to the structures comprising polymer 400 and polymer 405 discussed in Section 1.

Figure 4A:
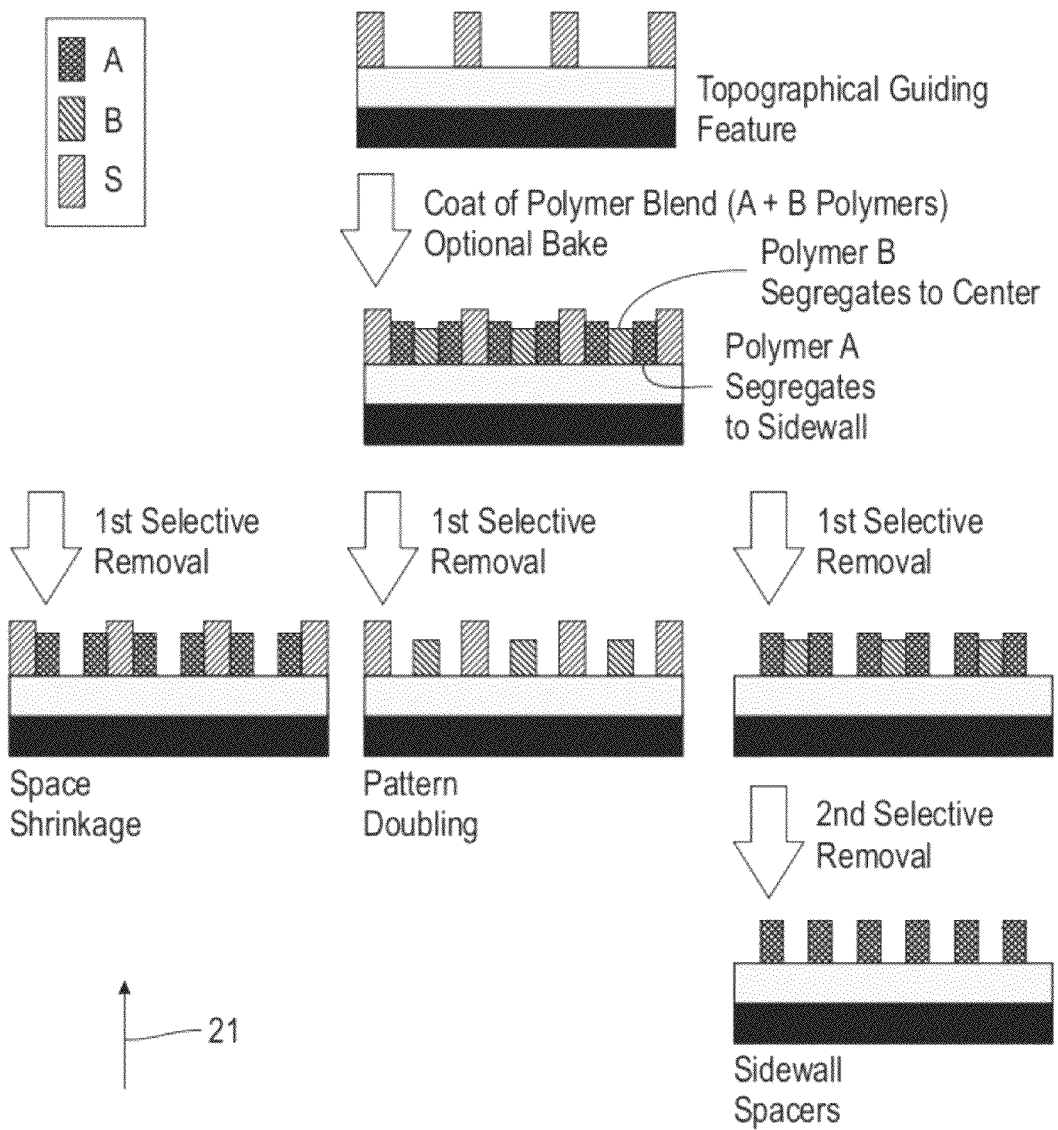
FIG. 4A depicts processes in which self assembled polymer structures are formed on a substrate, in accordance with embodiments of the present invention.
Figure 4B:
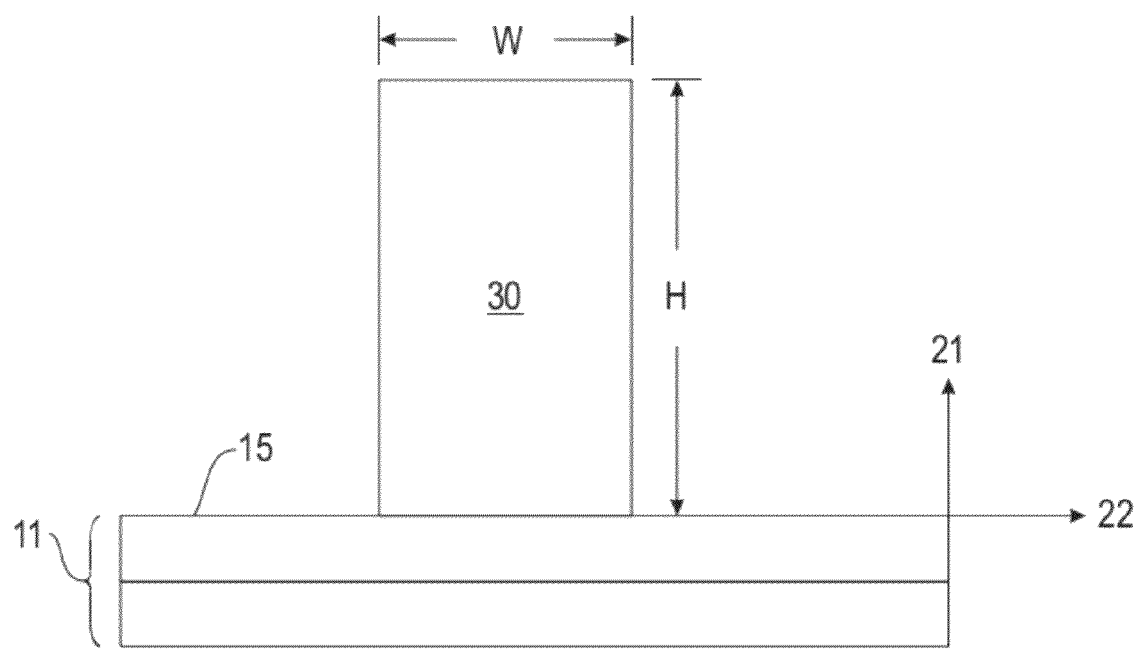
FIG. 4B depicts the substrate of FIG. 4A and a polymer structure disposed on an exterior surface of the substrate, in accordance with embodiments of the present invention.

FIG. 4A depicts processes in which self assembled polymer features are formed, in accordance with embodiments of the present invention. As shown in FIG. 4B, a solution of polymer blend of polymers A and B is cast onto a substrate 11 with resist features comprising substructures S. The polymer blend self-segregates between topographic features of substructures S to form the structure 10 as shown in FIG. 4A. In the case of a blend of two polymers A and B, both polymer A and polymer B flow into trenches or holes between the sidewalls of substructure S. Substrate 11 of FIG. 4A is analogous to substrate 101 of FIG. 1B. Substructure S of FIG. 4A is analogous to substructure 105 of FIG. 1C. The solution of the polymer blend used (but not explicitly shown) in conjunction with FIG. 4A is analogous to the solution 300 in FIG. 1B.

Since polymer A and polymer B have limited miscibility, this polymer blend of polymer A and polymer B tends to self-segregate into a polymer A region and a polymer B region where polymer A has higher affinity to the substructure S sidewall than polymer B. Therefore, polymer A preferentially segregates next to the sidewalls of substructure S and polymer B preferentially segregates to a center region between the substructures S. Polymers A and B of FIG. 4A are respectively analogous to polymers 400 and 405 of FIG. 1C.

After segregation, one or more polymers may be selectively removed from the segregated film (e.g., by alkaline developer, solvent, or plasma) while leaving at least one polymer on the substrate 11, as depicted in FIG. 4A. If polymer B is selectively removed, polymer A is left with the original topography, the result of which is a reduction (i.e., shrinking) of the lateral dimensions of the original topographical openings. If polymer A is selectively removed, the structures comprising polymer B along with the original topography of substructures S form a pattern with a doubled frequency (i.e., half the original spatial periodicity) relative to that of the original substructures S. If both the original topography of substructures S and polymer B are selectively removed, sidewall spacers of polymer A are formed on the substrates with a doubled frequency (i.e., half the original spatial periodicity) relative to that of the original substructures S.

FIG. 4B depicts the substrate 11 of FIG. 4A and a polymer structure 30 disposed on an exterior surface 15 of the substrate 11, in accordance with embodiments of the present invention. The polymer structure 30 comprises the polymer A or polymer B of FIG. 4A and is characterized by a height H and a width W. The height H of the polymer structure 30 is in the direction 21 that is perpendicular to the exterior surface 15 of the substrate 11. The width W of the polymer structure 30 is the average (e.g., mean, median) dimension of the polymer structure 30 (in the direction 22) in a plane that is perpendicular to the direction 21 and (equivalently) is parallel to the surface 15 of the substrate 11. The aspect ratio of the polymer structure 30 with respect to the surface 15 is defined as H/W.

For example, when the polymer structures and substrate form a line-space pattern, the width W of the polymer structure 30 is the average (e.g., mean, median) dimension of the polymer structure 30 in the direction 22, which is perpendicular to the lines (that is, the width of the lines rather than the length of the lines). For arbitrary patterns for which there are two or more possible widths W in the plane perpendicular to direction 21, the smallest width should be used in the calculation of the aspect ratio.

The cross-sectional shape of polymer structure 30 in a perpendicular plane that is perpendicular to the direction 21 may be polygonal (e.g., rectangular, square pentagonal), circular, etc.

Figure 5A:
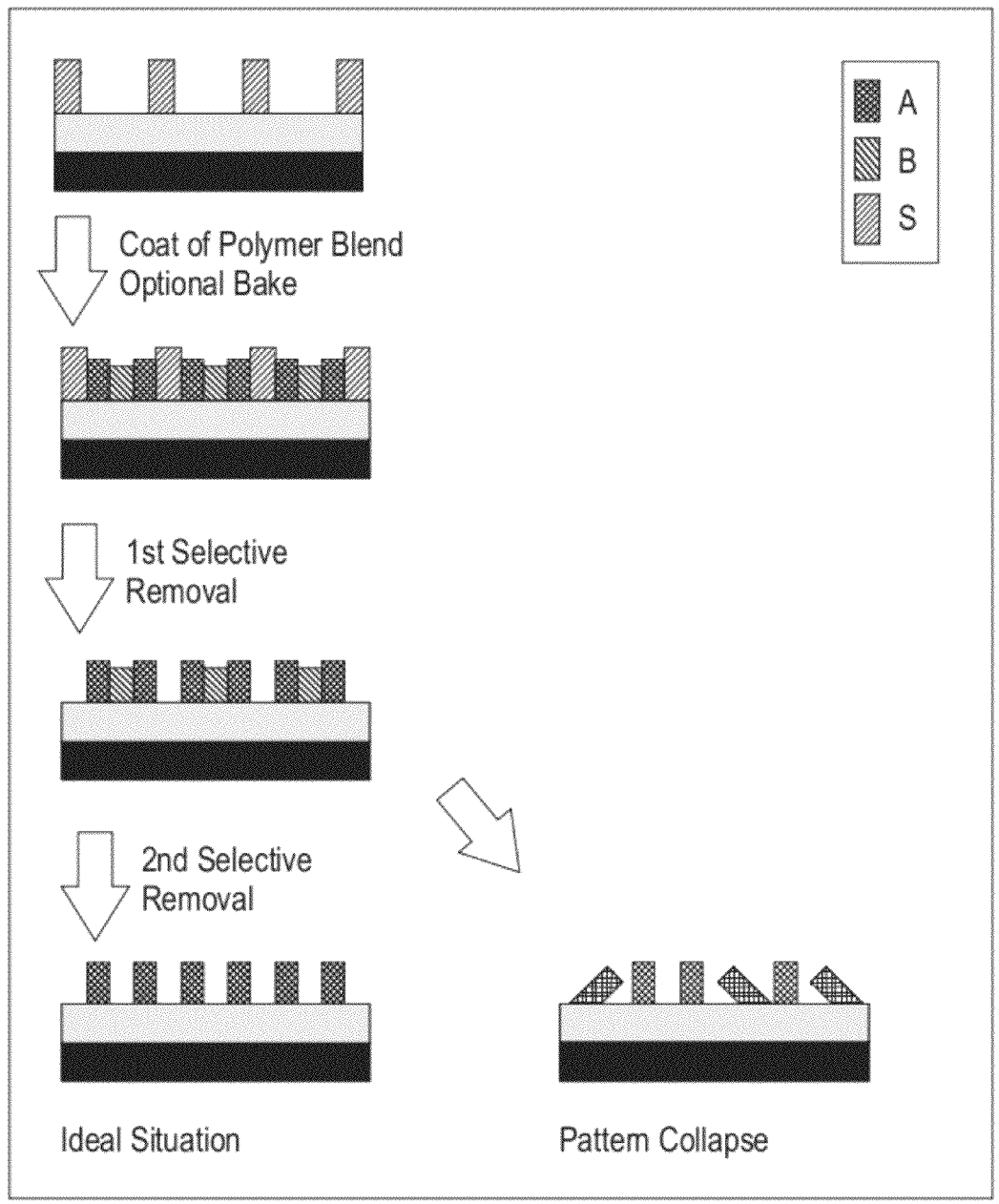
FIGS. 5A-5B illustrate collapse of the polymer spacer pattern of FIG. 4A, in accordance with embodiments of the present invention.
Figure 5B:
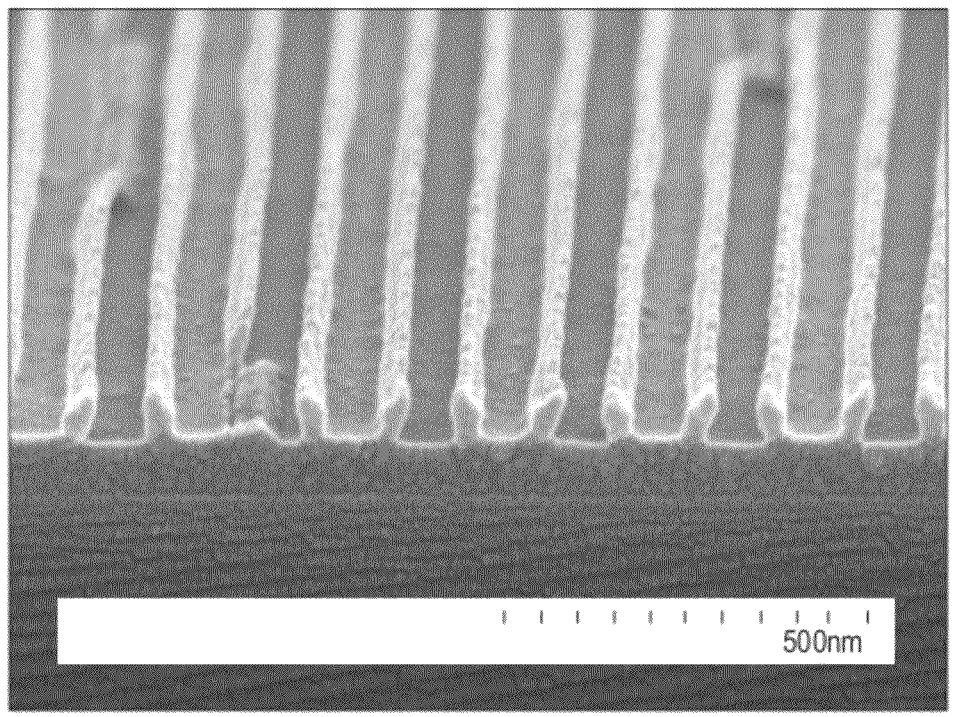

FIGS. 5A-5B illustrates collapse of the polymer spacer pattern of FIG. 4A, in accordance with embodiments of the present invention. FIG. 5A depicts an ideal situation in which the pattern does not collapse and a non-ideal situation in which the pattern collapses during the second selective removal step. FIG. 5B shows cross-section scanning electron microscopy (SEM) image of collapsed patterns from a polymer blend. The collapse of the pattern depicted in FIG. 5B results from the aspect ratios of structures comprising polymer A in the pattern being too high to maintain structural stability during the second selective removal step.

Pattern collapse is a critical patterning defect caused by the deformation of the patterned features due to the capillary forces experienced during wet development processing. The maximum stress imparted on the patterned features is mainly determined by the interfacial tension of rinse solvent, the space width in between patterns, and the aspect ratio of the patterned features. Of course, pattern collapse also depends upon the pattern geometry, the mechanical modulus of the patterned features, the adhesion of the patterned features to the underlying substrate, and other factors. However, of the possible methods to prevent pattern collapse, reducing the aspect ratio is the easiest and most effective method to reduce the maximum stress and thereby minimize pattern collapse. There are two ways to reduce aspect ratio: reducing the vertical height or increasing lateral width; however, only by reducing the vertical height of the features can high pattern densities be maintained.

The present invention provides a method and system configured to improve the profiles of polymer features, such as polymer features from self-segregated polymer blends, by preventing or reducing collapse of the polymer spacer pattern.

FIGS. 6A-6D depict a reference process (FIG. 6A) and three slimming processes (FIGS. 6B-6D) for generating final structures 60-63, in accordance with embodiments of the present invention. The step of "slimming" a polymer structure means reducing the vertical aspect ratio of the polymer structure with respect to the exterior surface of the substrate that the polymer structure is disposed on. The reference process of FIG. 6A generates the final structure 60 without slimming. The three slimming processes of FIGS. 6B-6D remove the substructure S, decrease the aspect ratio of a first polymer structure (comprising polymer A) disposed between a second polymer structure (comprised of polymer B) and a sidewall of the substructure S, and remove the second polymer structure (comprising polymer B). The processes of FIGS. 6B-6D prevent or reduce collapse of the polymer spacer pattern.

Figure 6A:
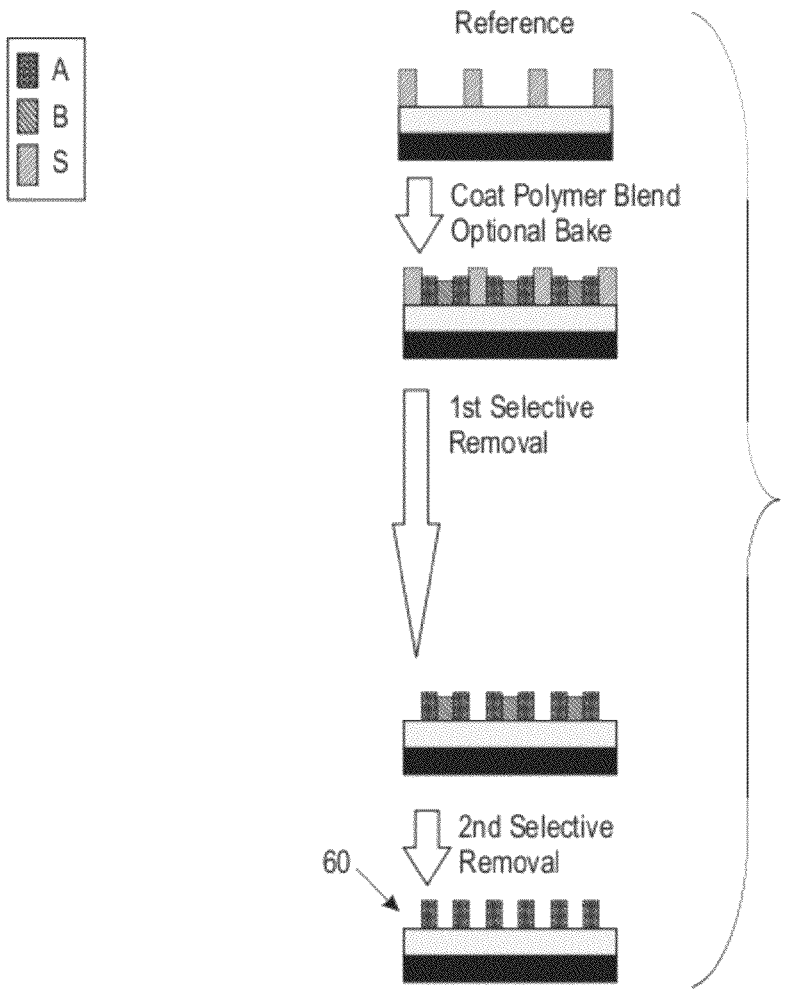
FIGS. 6A-6D depict a reference process and three slimming processes for generating final structures, in accordance with embodiments of the present invention

FIG. 6A depicts two selective removal (e.g., wet development, plasma etch, etc.) steps in succession to selectively remove the topography feature (substructure S) in the first selective removal step and to selectively remove polymer B structures (comprising polymer B) in the second selective removal step, which results in the polymer A spacer pattern depicted the final structure 60. Unlike the processes of FIGS. 6B-6C, there is no slimming step in the process of FIG. 6A.

Although FIG. 6A depicts the selective removal of the topographic substructures S being performed in the first selective removal step before the selective removal of the polymer B structures is performed in the second selective removal step, the selective removal of the polymer B structures may alternatively be performed before the selective removal of the topographic substructures S in one embodiment.

Figure 7A:
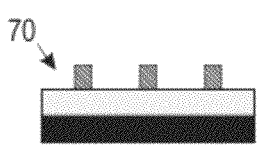
FIGS. 7A-7D depict final structures resulting from a reference process and from three slimming processes which remove a substructure and decrease the aspect ratio of a second polymer structure such that the first polymer structure is disposed between the second polymer structure and a sidewall of the substructure, in accordance with embodiments of the present invention.

An alternative embodiment with respect to FIG. 6A is to selectively remove the polymer A structures (instead of polymer B structures) in the second selective removal step, which results in the polymer B spacer pattern in the final structure 70 depicted in FIG. 7A (discussed infra) instead of the polymer A spacer pattern in the final structure 60 depicted in FIG. 6A.

FIGS. 7A-7D depict final structures resulting from a reference process (FIG. 7A) and from three slimming processes (FIGS. 7B-7D) which remove the substructure S, decrease the aspect ratio of a second polymer structure (comprising polymer B), and remove a first polymer structure (comprising polymer A) that had been disposed between the second polymer structure (comprising polymer B) and a sidewall of the substructure S, in accordance with embodiments of the present invention. The processes of FIGS. 7B-7D prevent or reduce collapse of the polymer spacer pattern.

Figure 8A:
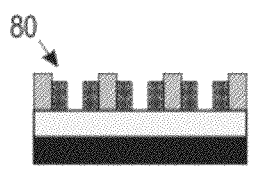
FIGS. 8A-8D depict final structures resulting from a reference process and from three slimming processes which do not remove substructure and decrease the aspect ratio of a first polymer structure disposed between a second polymer structure and a sidewall of the substructure, in accordance with embodiments of the present invention.

In one embodiment, the first selective removal step of FIG. 6A is not performed and the second selective removal step removes polymer B, resulting in the topography feature (substructure S) remaining in the final structure 80 depicted in FIG. 8A (discussed infra) which is analogous to the Space Shrinkage structure in FIG. 4A.

FIGS. 8A-8D depict final structures 80-83, respectively, resulting from a reference process (FIG. 8A) and from three slimming processes (FIGS. 8B-8D) which do not remove the substructure S, decrease the aspect ratio of a first polymer structure (comprising polymer A) disposed between a second polymer structure (comprised of polymer B) and a sidewall of the substructure S, and remove the second polymer structure (comprising polymer B), in accordance with embodiments of the present invention.

Figure 9A:
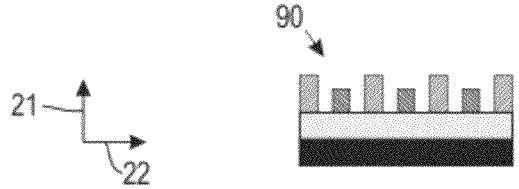
FIGS. 9A-9D depict final structures resulting from a reference process and from three slimming processes which do not remove a substructure and decrease the aspect ratio of a second polymer structure such that the first polymer structure is disposed between the second polymer structure and a sidewall of the substructure, in accordance with embodiments of the present invention.

In one embodiment, the first selective removal step of FIG. 6A is not performed and the second selective removal step removes polymer A structures (as in the alternative embodiment of FIG. 7A described supra), resulting in the topography feature (substructure S) remaining in the final structure 90 depicted in FIG. 9A (discussed infra) which is analogous to the Pattern Doubling structure in FIG. 4A.

FIGS. 9A-9D depict final structures 90-93, respectively, resulting from a reference process (FIG. 9A) and from three slimming processes (FIGS. 9B-9D) which do not remove the substructure S, decrease the aspect ratio of a second polymer structure (comprising polymer B), and remove a first polymer structure (comprising polymer A) that had been disposed between the second polymer structure (comprising polymer B) and a sidewall of the substructure S, in accordance with embodiments of the present invention.

"Slimming First" Process

Figure 6B:
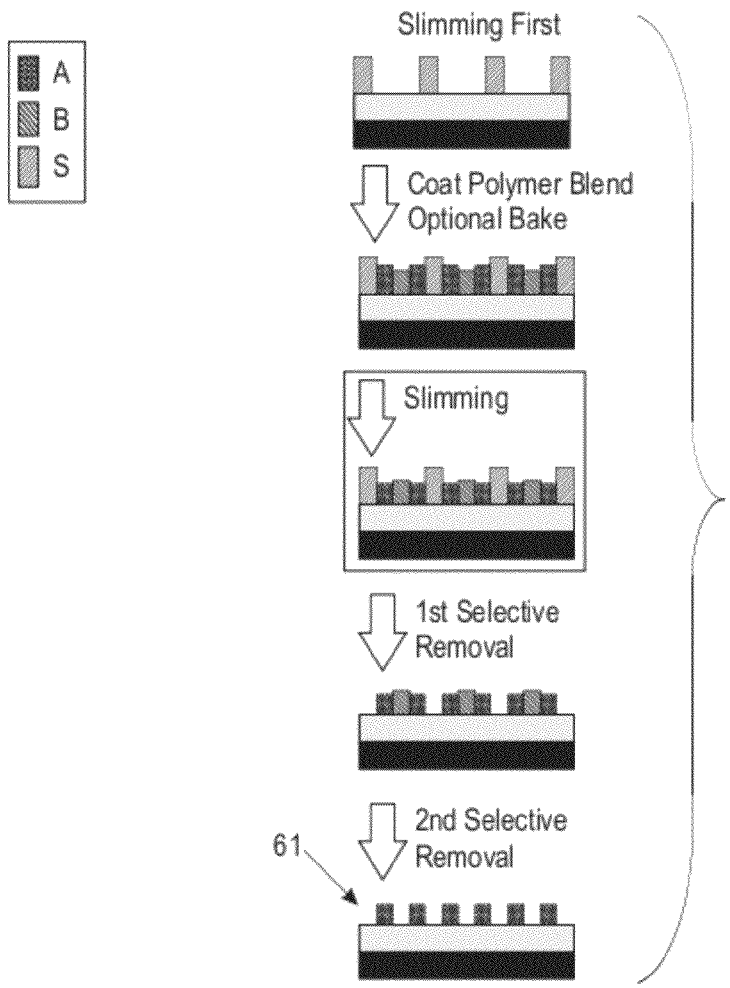

FIG. 6B depicts a "slimming first" process in which a slimming solvent (or another removal process such as a plasma etch) is applied before a first selective removal step to reduce the height of a polymer A structure (in the direction 21) which reduces the aspect ratio of a polymer A structure with respect to the exterior surface of the substrate. The slimming step in FIG. 6B serves to reduce the height of a polymer A structure in direction 21, resulting in a shorter polymer A structure with a reduced aspect ratio. In one embodiment, the height of a polymer B structure in direction 21 is also reduced in the slimming step of FIG. 6B. In this case, shorter sidewall spacers form after slimming and two selective removal steps (e.g., wet development steps) in succession to selectively remove the topography feature (substructure S) in the first selective removal step and then to selectively remove a polymer B structure in the second selective removal step, which results in the polymer A spacer pattern depicted the final structure 61 that has shorter spacers than in the final structure 60 of FIG. 6A.

Although FIG. 6B depicts the selective removal of the polymer B structures being performed in the second selective removal step after the selective removal of the topographic substructures S is performed in the first selective removal step, in one embodiment the selective removal of the polymer B structures may instead be performed before the selective removal of the topographic substructures S is performed.

Figure 7B:
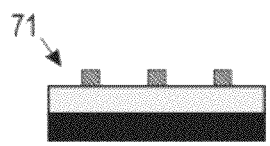

An alternative embodiment with respect to FIG. 6B is to reduce the height of a polymer B structure (or of both a polymer B and a polymer A structure) in the slimming step and selectively remove a polymer A structure (instead of a polymer B structure) in the second selective removal step, which results in the polymer B spacer pattern in the final structure 71 depicted in FIG. 7B instead of the polymer A spacer pattern in the final structure 61 depicted in FIG. 6B. The final structure 71 depicted in FIG. 7B has shorter spacers than does the final structure 70 depicted in FIG. 7A.

Figure 8B:
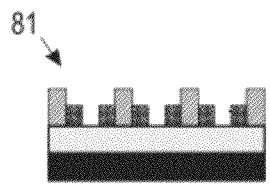

In one embodiment, the first selective removal step of FIG. 6B is not performed and the second selective removal step removes a polymer B structure, resulting in the topography feature (substructure S) remaining in the final structure 81 depicted in FIG. 8B which is analogous to the Space Shrinkage structure in FIG. 4A.

Figure 9B:
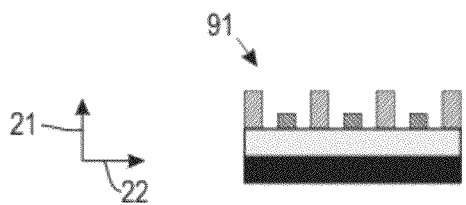

In one embodiment, the first selective removal step of FIG. 6B is not performed and the second selective removal step removes a polymer A structure (as in the alternative embodiment of FIG. 6B described supra), resulting in the topography feature (substructure S) remaining in the final structure 91 depicted in FIG. 9B which is analogous to the Pattern Doubling structure in FIG. 4A.

"Slimming Between" Process

Figure 6C:
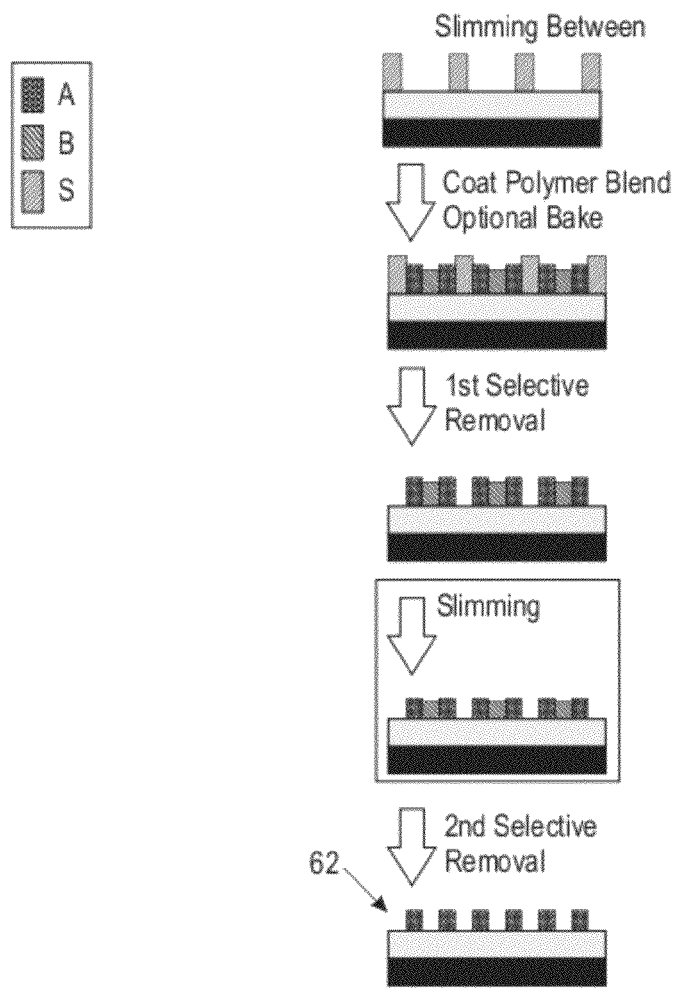

FIG. 6C depicts a "slimming between" process in which a slimming solvent (or another removal process such as a plasma etch) is used after a first selective removal step, and before a second selective removal step, to reduce the height of a polymer A structure (in the direction 21) which reduces the aspect ratio of a polymer A structure with respect to the exterior surface of the substrate. The slimming step in FIG. 6C serves to reduce the height in direction 21 of a polymer A structure, resulting in a shorter polymer A structure with a reduced aspect ratio. In one embodiment, the height of a polymer B structure in direction 21 is also reduced in the slimming step of FIG. 6C. The two selective removal steps (e.g., wet development steps) are performed to selectively remove the topography feature (substructure S) in the first selective removal step and then (after the slimming step) to selectively remove a polymer B structure in the second selective removal step, which results in the polymer A spacer pattern of the final structure 62 in FIG. 6C that has shorter spacers than in the final structure 60 depicted in FIG. 6A.

Although FIG. 6C depicts the slimming step being performed after selective removal of the topographic substructures S is performed in the first selective removal step and before the selective removal of polymer B structures is performed in the second selective removal step, in one embodiment the slimming step is performed after the selective removal of polymer B structures is performed and before the selective removal of the topographic substructures S is performed (i.e., the sequence of steps may interchange the first and second selective removal steps).

Figure 7C:
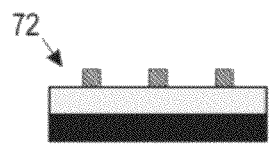

An alternative embodiment with respect to FIG. 6C is to reduce the height of a polymer B structure (or of both polymer B and polymer A structures) in the slimming step and selectively remove a polymer A structure (instead of a polymer B structure) in the second selective removal step, which results in the polymer B spacer pattern in the final structure 72 depicted in FIG. 7C instead of the polymer A spacer pattern in the final structure 62 depicted in FIG. 6C. The final structure 72 depicted in FIG. 7C has shorter spacers than does the final structure 70 depicted in FIG. 7A.

Figure 8C:
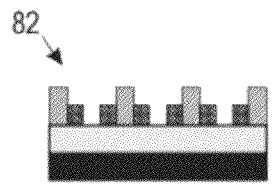

In one embodiment, the first selective removal step of FIG. 6C is not performed and the second selective removal step removes a polymer B structure, resulting in the topography feature (substructure S) remaining in the final structure 82 depicted in FIG. 8C which is analogous to the Space Shrinkage structure in FIG. 4A. This embodiment resulting in the final structure 82 depicted in FIG. 8C is the exact same process that has resulted in the final structure 81 depicted in FIG. 8B, due to the first selective removal step not being performed (i.e., the distinction between "slimming first" and "slimming between" has disappeared).

Figure 9C:
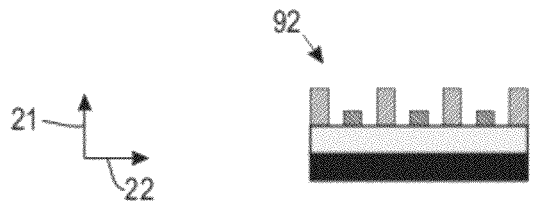

In one embodiment, the first selective removal step of FIG. 6C is not performed and the second selective removal step removes a polymer A structure (as in the alternative embodiment of FIG. 7C described supra), resulting in the topography feature (substructure S) remaining in the final structure 92 depicted in FIG. 9C which is analogous to the Pattern Doubling structure in FIG. 4A. This embodiment resulting in the final structure 92 depicted in FIG. 9C is the exact same process that has resulted in the final structure 91 depicted in FIG. 9B, due to the first selective removal step not being performed (i.e., the distinction between "slimming first" and "slimming between" has disappeared).

"Slimming Together" Process

Figure 6D:
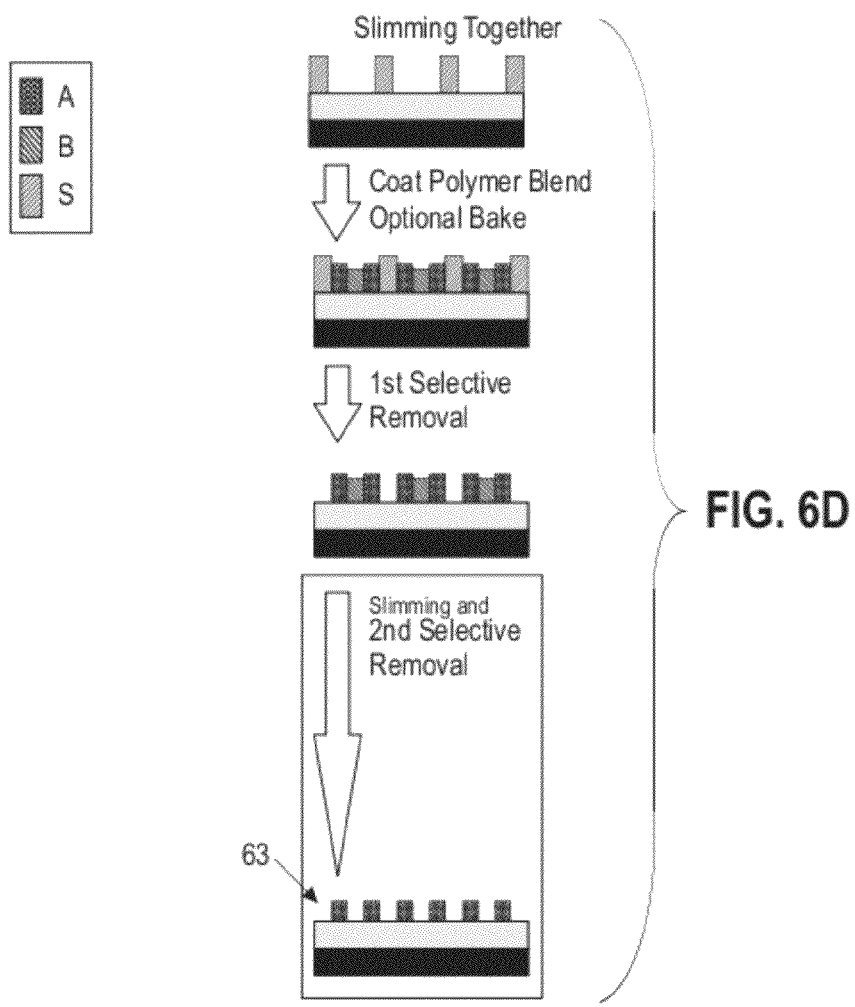

FIG. 6D depicts a "slimming together" process in which a "slimming together" step is performed after a first selective removal step is performed. The first selective removal step (e.g., a wet development step) selectively removes the topography feature (substructure S). In the "slimming together" step, a mixture of the slimming solvent for polymer A and the developer for polymer B is applied to simultaneously selectively remove a polymer B structure and reduce the height of a polymer A structure in the direction 21 to reduce the aspect ratio of a polymer A structure with respect to the exterior surface of the substrate. The slimming aspect of the "slimming together" step in FIG. 6D serves to reduce the height of a polymer A structure, resulting in a shorter a polymer A structure with a reduced aspect ratio. The polymer A spacer pattern in the final structure 63 depicted in FIG. 6D resulting from the "slimming together" step has shorter spacers than the spacers in the final structure 60 depicted in FIG. 6A.

Figure 7D:
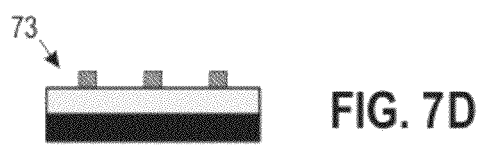

An alternative embodiment for FIG. 6D is to perform the "slimming together" step such that a mixture of the slimming solvent for polymer B and the developer for polymer A is applied to simultaneously selectively remove polymer A and reduce the height of a polymer B structure in the direction 21 to reduce the aspect ratio of a polymer B structure. In the alternative embodiment, the slimming aspect of the "slimming together" step serves to reduce the height of a polymer B structure, resulting in a shorter polymer B structure with a reduced aspect ratio. The polymer B spacer pattern in the final structure 73 resulting from the "slimming together" step is depicted in FIG. 7D and has shorter spacers than has the final structure 70 depicted in FIG. 7A.

Figure 8D:
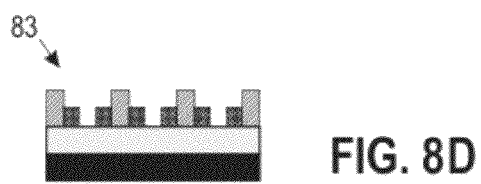

In one embodiment, the first selective removal step of FIG. 6D is not performed and the second selective removal step slims a polymer A structure and selectively removes a polymer B structure, resulting in the topography feature (substructure S) remaining in the final structure 83 depicted in FIG. 8D which is analogous to the Space Shrinkage structure in FIG. 4A.

Figure 9D:
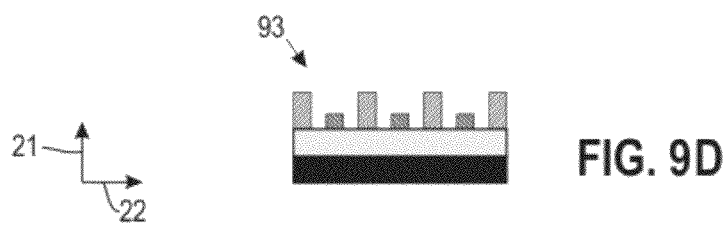

In one embodiment, the first selective removal step of FIG. 6D is not performed and the second selective removal step slims a polymer B structure and selectively removes a polymer A structure (as in the alternative embodiment of FIG. 7D described supra), resulting in the topography feature (substructure S) remaining in the final structure 93 depicted in FIG. 9D which is analogous to the Pattern Doubling structure in FIG. 4A.

In the slimming schemes of FIGS. 6B-6D, 7B-7D, 8B-8D, and 9B-9D, the slimming process decreases the aspect ratios of polymer features and therefore significantly reduces pattern collapse.

If the slimming step is performed chemically by using a slimming solution, then the slimming solution may selectively remove material from both the top surface and exposed side surfaces of a polymer B structure (or a polymer A structure in the alternative embodiments) in the slimming steps of FIGS. 6B-6D. Since removing material from the side surfaces of the polymer structure counteracts the benefit of removing material from the top surface of the polymer structure with respect to its aspect ratio, the parameters of the slimming step, which include the time duration of the slimming step, should be controlled to ensure that the resultant aspect ratio is within acceptable limits.

The slimming solution may comprise water, acids, bases, monohydric alcohols, polyhydric alcohols, polyhydric alcohol partial ethers, ketones, amides, ethers, esters, carbonates, aliphatic hydrocarbons, aromatic hydrocarbons, and halogen-containing solvents. The slimming solution may comprise the aforementioned solvents either individually, or in a combination of two or more. In addition, other parameters including volatility, flash point, swelling, and other properties should be considered. The composition of the slimming solution should be chosen so the desired selectivity in terms of the dissolution rate of the selected polymer structure vis-à-vis the other polymer structures and substructures is obtained. The slimming solution may also comprise additives such as surfactants, stabilizers, anti-foaming agents, and the like necessary to improve performance and minimize defectivity.

In one embodiment, the slimming solvent may comprise an acid selected from the group of acetic acid, trifluoroacetic acid, methanesulfonic acid, trifluoromethanesulfonic acid, perfluorobutanesulfonic acid, p-toluenesulfonic acid, sulfuric acid, nitric acid, hydrochloric acid, hydrofluoric acid, and the like. The acid concentration may be adjusted by dilution with a non-acidic solvent such as water (e.g., dilute aqueous hydrofluoric acid).

In one embodiment, the slimming solvent may comprise a base selected from the group consisting of ammonium hydroxide, tetramethylammonium hydroxide, tetrabutylammonium hydroxide, and the like.

In one embodiment, the slimming solvent may comprise a monohydric alcohol selected from the group consisting of methanol, ethanol, n-propanol, iso-propanol, n-butanol, iso-butanol, sec-butanol, tert-butanol, n-pentanol, iso-pentanol, 2-methylbutanol, sec-pentanol, t-pentanol, 3-methoxybutanol, n-hexanol, 2-methylpentanol, 4-methyl-2-pentanol, sec-hexanol, 2-ethylbutanol, sec-heptanol, 3-heptanol, n-octanol, 2-ethylhexanol, sec-octanol, n-nonyl alcohol, 2,6-dimethyl-4-heptanol, n-decanol, sec-undecyl alcohol, trimethylnonyl alcohol, sec-tetradecyl alcohol, sec-heptadecyl alcohol, furfuryl alcohol, phenol, cyclohexanol, methylcyclohexanol, 3,3,5-trimethylcyclohexanol, benzyl alcohol, diacetone alcohol, and the like.

In another embodiment, the slimming solvent may comprise a polyhydric alcohol selected from the group consisting of ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, and tripropylene glycol, and the like.

In another embodiment, the slimming solvent may comprise a polyhydric alcohol partial ether solvent selected from the group consisting of ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, and dipropylene glycol monopropyl ether; and the like.

These alcoholic solvents may be used either individually, or in a combination of two or more.

In another embodiment, the slimming solvent may comprise a ketone selected from the group consisting of acetone, methyl ethyl ketone, methyl n-propyl ketone, methyl n-butyl ketone, diethyl ketone, methyl iso-butyl ketone, methyl n-pentyl ketone, ethyl n-butyl ketone, methyl n-hexyl ketone, di-iso-butyl ketone, trimethylnonanone, cyclopentanone, cyclohexanone, cycloheptanone, cyclooctanone, 2-hexanone, methylcyclohexanone, 2,4-pentanedione, acetonylacetone, diacetone alcohol, acetophenone, fenchone, and the like. These ketone solvents may be used either individually, or in a combination of two or more.

In another embodiment, the slimming solvent may comprise an amide selected from the group consisting of N,N-dimethylimidazolidinone, N-methylformamide, N,N-dimethylformamide, N,N-diethylformamide, acetamide, N-methylacetamide, N,N-dimethylacetamide, N-methylpropionamide, and N-methylpyrrolidone and the like. These amide solvents may be used either individually, or in a combination of two or more.

In another embodiment, the slimming solvent may comprise an ethereal solvent selected from the group consisting of ethyl ether, iso-propyl ether, n-butyl ether, n-hexyl ether, 2-ethylhexyl ether, ethylene oxide, 1,2-propylene oxide, dioxolane, 4-methyl dioxolane, dioxane, dimethyl dioxane, ethylene glycol monomethyl ether, ethylene glycol dimethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethyl butyl ether, ethylene glycol dibutyl ether, diethylene glycol monomethyl ether, diethylene glycol dimethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxy triglycol, tetraethylene glycol di-n-butyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, tripropylene glycol monomethyl ether, tetrahydrofuran, 2-methyltetrahydrofuran, diphenyl ether, anisole and the like. These ethereal solvents may be used either individually, or in a combination of two or more.

In another embodiment, the slimming solvent may comprise esters and carbonates selected from the group consisting of diethyl carbonate, propylene carbonate, methyl acetate, ethyl acetate, γ-butyrolactone, γ-valerolactone, n-propyl acetate, iso-propyl acetate, n-butyl acetate, iso-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxy triglycol acetate, ethyl propionate, n-butyl propionate, iso-amyl propionate, diethyl oxalate, di-n-butyl oxalate, methyl lactate, ethyl lactate, n-butyl lactate, n-amyl lactate, diethyl malonate, dimethyl phthalate, diethyl phthalate, and the like. These esters and carbonates may be used either individually, or in a combination of two or more.

In another embodiment, the slimming solvent may comprise an aliphatic hydrocarbon selected from the group consisting of n-pentane, iso-pentane, n-hexane, iso-hexane, n-heptane, iso-heptane, 2,2,4-trimethylpentane, n-octane, iso-octane, cyclohexane, methylcyclohexane, and the like. These aliphatic hydrocarbon solvents may be used either individually, or in a combination of two or more.

In another embodiment, the slimming solvent may comprise an aromatic hydrocarbon solvent selected from the group consisting of benzene, toluene, xylene, ethylbenzene, trimethylbenzene, methylethylbenzene, n-propylbenzene, iso-propylbenzene, diethylbenzene, iso-butylbenzene, triethylbenzene, di-1-propylbenzene, n-amylnaphthalene, trimethylbenzene, and the like. These aromatic hydrocarbon solvents may be used either individually, or in a combination of two or more.

In another embodiment, the slimming solvent may comprise a halogen-containing solvent selected from the group consisting of dichloromethane, chloroform, fluorocarbon, chlorobenzene, dichlorobenzene, and the like. These halogen-containing solvents may be used either individually, or in a combination of two or more.

In one embodiment, the slimming process is stopped by rapidly spinning the wafer to remove the developing solvent. In another embodiment the slimming process is stopped by removing the developing solvent by the application of a lower quality solvent or a non-solvent for the material being removed by the slimming process. This application can be accomplished by spraying or puddling the lower quality solvent on the substrate, by dipping/immersing the substrate in the lower quality solvent, or by combinations thereof.

In one embodiment, a plasma etch, instead of a chemical etch, may be used to perform the slimming step anisotropically such that only the top exposed surface (and not the side surfaces) of the polymer are etched. Many suitable, plasma etching and reactive ion etching processes are known in the literature. Dry etching conditions can be applied as described in the art to achieve anisotropic removal of material. Polymer structures can be etched by various plasmas generated from reactive gases (such as $O_2$, $CF_4$) and/or noble gases (such as argon, helium). The etch rate can be adjusted by the plasma composition, power, and voltage, thereby enabling adjustment of the final aspect ratio of the polymer structure. It should be noted that the etch rate of the polymer in the plasma is dependent on the composition of the polymer. For example, inorganic-containing polymers (such as silicon-containing polymers) have lower etch rates in oxygen plasma than purely organic polymers. For any given polymer material, the etch conditions (time, power, voltage, and plasma composition) should be adjusted to render polymer structures of proper aspect ratios.

The threshold aspect ratio, which is a demarcation line between a polymer structure in the final structure (i.e., structures 61-63 in FIGS. 6B-6D; structures 71-73 in FIGS. 7B-7D; structures 81-83 in FIGS. 8B-8D; structures 91-93 in FIGS. 9B-9D), depends on the material of the polymer and the polymer pitch (i.e., the distance between successive polymers in the direction 22) due to the capillary force during the second selective removal step that draws successive polymers together. For example, for large features (i.e., large pitch) a 3:1 aspect ratio may be acceptable for mechanical stability, but if the pitch is small (e.g., 28 nm) the threshold aspect ratio may be less than 1.5:1.

The stress by capillary force, which can cause pattern collapse, can be decreased by increasing the space between patterned features or by decreasing the aspect ratio of the patterned features. Since the former method is impractical given the need for ever denser patterns with smaller lateral feature sized, this means that a smaller aspect ratio is needed for making smaller pitch patterns. The desirable aspect ratio is roughly under 4 for 120-nm pitch patterns, 3 for 80-nm pitch patterns, and 2 for 40-nm pitch patterns. Of course, these values also depend upon the pattern geometry, the mechanical modulus of the patterned features, adhesion of the patterned features to the underlying substrate, and other factors. However, an aspect ratio of 1.5 or less is needed for 30-nm or less pitch patterns.

In one embodiment, the first and second polymers are each selected from the group consisting of cellulose, poly(acrylamide), polyethyleneimine, poly(acrylic acid), poly(2-ethyl-2-oxazoline), poly(ethyleneoxide), and poly(vinyl alcohol), novolac resins, cresol resins, poly(hydroxystyrene), poly(acrylic acid), poly(styrene sulfonic acid), poly(vinyl phosphoric acid), poly(vinyl sulfonic acid), poly(2-sulfoethyl methacrylate), poly(2-sulfopropyldimethyl-3-methacrylamide), poly(1,1,1-trifluoro-2-(trifluoromethyl)-2-hydroxy-pentan-4-yl methacrylate), fluoroalcohol-based polymers, poly(2-ethyl-trifluoromethanesulfonamide methacrylate), acidic sulfonamide polymers, poly(styrene), poly(hydroxyadamantyl methacrylate), poly(isobornyl methacrylate), poly(phenyl methacrylate), poly(vinyl naphthalene), polysiloxanes, polymethylsilsesquioxanes, polycarbosilanes, poly(vinyl ferrocene), poly(acylonitrile), poly(caprolactone), poly(lactide), poly(methyl methacrylate), poly(2-hydroxyethyl methacrylate), poly(gamma-butyrolactone methacrylate), poly(tetrahydrofuranyl methacrylate), poly(tetrahydropyranyl methacrylate), poly(allyl amine), poly(4-aminostyrene), poly(2-dimethylaminoethyl methacrylate), polyethyleneimine, poly(N-methylvinylamine), poly(vinyl pyridine), poly(isoprene), poly(butadiene), poly(norbornene), poly(ethylene), poly(propylene), poly(1,1,1-trifluoro-2-(trifluoromethyl)-2-hydroxy-pentan-4-yl methacrylate), fluoroalcohol-based polymers, poly(2-ethyl-trifluoromethanesulfonamide methacrylate), acidic fluorosulfonamide polymers, poly(2,2,2-trifluoroethyl methacrylate), poly(hexafluoroisopropyl methacrylate), poly(2,3,4,5,6-pentafluorostyrene), and substituted derivatives thereof.

Since the vertical aspect ratio of the polymer features are reduced in the present invention, there is less material (e.g., a smaller vertical thickness of the patterned material) remaining to serve as a etch barrier during pattern transfer to the substrate 101 of any of the spacer patterns of FIGS. 7B-7D, 8B-8D, 9B-9D. If the vertical thickness of the material is reduced too much, an insufficient thickness will exist for the polymer pattern to serve as an etch barrier during pattern transfer. That is, the polymer pattern will be entirely consumed by the etch process prior to completion of the pattern transfer process. Therefore, it may be advantageous to use a polymer with an increased etch resistance relative to that of the underlying substrate to compensate for the reduced vertical aspect ratio. For example, when the substrate is an organic material, the use of a polymer with a high concentration of a refractory oxide-forming element such as silicon or germanium enables the pattern to be transferred into the underlying organic material using an oxygen-based plasma etch process. Increasing the silicon (or germanium) content in the polymer increases its resistance to oxygen plasma and allows thinner layers of polymer to be used in the pattern transfer process.

In one embodiment, the first polymer and/or second polymer is selected from the group consisting of a silicon-containing polymer which is obtained by the hydrolysis and condensation of at least one hydrolyzable silane compound selected from a hydrolyzable silane compound shown by the following formula (1) (hereinafter referred to from time to time as "compound (1)"), a hydrolyzable silane compound shown by the following formula (2) (hereinafter referred to from time to time as "compound (2)"), and a hydrolyzable silane compound shown by the following formula (3) (hereinafter referred to from time to time as "compound (3)").

$$R_a Si(OR^1)_{4-a} \quad (1)$$

wherein R represents a fluorine atom, a linear or branched alkyl group having 1 to 5 carbon atoms, an alkenyl group having 2 to 6 carbon atoms, or an alkylcarbonyloxy group, $R^1$ represents a monovalent organic group, and a represents an integer from 1 to 3,

$$Si(OR^2)_4 \quad (2)$$

wherein $R^2$ represents a monovalent organic group.

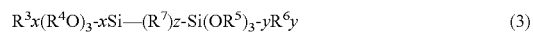

$$R^3{}_x(R^4O)_{3-x}Si-(R^7)_z-Si(OR^5)_{3-y}R^6{}_y \quad (3)$$

wherein $R^3$ and $R^6$ individually represent a fluorine atom, an alkylcarbonyloxy group, or a linear or branched alkyl group having 1 to 5 carbon atoms, $R^4$ and $R^5$ individually represent a monovalent organic group, x and y individually represent a number from 0 to 2, and $R^7$ represents an oxygen atom, a phenylene group, or a group $-(CH_2)_m-$ (wherein m represents an integer from 1 to 6), and z represents 0 or 1.

Specific examples of the compound (1) shown by the formula (1) may include: methyltrimethoxysilane, methyltriethoxysilane, methyltri-n-propoxysilane, methyltriisopropoxysilane, methyltri-n-butoxysilane, methyltri-sec-butoxysilane, methyltri-t-butoxysilane, methyltriphenoxysilane, ethyltrimethoxysilane, ethyltriethoxysilane, ethyltri-n-propoxysilane, ethyltriisopropoxysilane, ethyltri-n-butoxysilane, ethyltri-sec-butoxysilane, ethyltri-t-butoxysilane, ethyltriphenoxysilane, n-propyltrimethoxysilane, n-propyltriethoxysilane, n-propyltri-n-propoxysilane, n-propyltriisopropoxysilane, n-propyltri-n-butoxysilane, n-propyltri-sec-butoxysilane, n-propyltri-t-butoxysilane, n-propyltriphenoxysilane, isopropyltrimethoxysilane, isopropyltriethoxysilane, isopropyltri-n-propoxysilane, isopropyltriisopropoxysilane, isopropyltri-n-butoxysilane, isopropyltri-sec-butoxysilane, isopropyltri-t-butoxysilane, isopropyltriphenoxysilane, n-butyltrimethoxysilane, n-butyltriethoxysilane, n-butyltri-n-propoxysilane, n-butyltriisopropoxysilane, n-butyltri-n-butoxysilane, n-butyltri-sec-butoxysilane, n-butyltri-t-butoxysilane, n-butyltriphenoxysilane, sec-butyltrimethoxysilane, sec-butyliso-triethoxysilane, sec-butyltri-n-propoxysilane, sec-butyltriisopropoxysilane, sec-butyltri-n-butoxysilane, sec-butyltri-sec-butoxysilane, sec-butyltri-t-butoxysilane, sec-butyltriphenoxysilane, tert-butyltrimethoxysilane, tert-butyltriethoxysilane, tert-butyltri-n-propoxysilane, tert-butyltriisopropoxysilane, tert-butyltri-n-butoxysilane, tert-butyltri-sec-butoxysilane, tert-butyltri-t-butoxysilane, tert-butyltriphenoxysilane, dimethyldimethoxysilane, dimethyldiethoxy silane, dimethyl-di-n-propoxysilane, dimethyldiisopropoxysilane, dimethyl-di-n-butoxysilane, dimethyl-di-sec-butoxysilane, dimethyl-di-tert-butoxysilane, dimethyldiphenoxysilane, diethyldimethoxysilane, diethyldiethoxysilane, diethyl-di-n-propoxysilane, diethyldiisopropoxysilane, diethyl-di-n-butoxysilane, diethyldi-sec-butoxysilane, diethyl-di-tert-butoxysilane, diethyldiphenoxysilane, di-n-propyldimethoxysilane, di-n-propyldiethoxysilane, di-n-propyl-di-n-propoxysilane, di-n-propyldiisopropoxysilane, di-n-propyl-di-n-butoxysilane, di-n-propyl-di-sec-butoxysilane, di-n-propyl-di-tert-butoxysilane, di-n-propyl-di-phenoxysilane, diisopropyldimethoxysilane, diisopropyldiethoxysilane, diisopropyl-di-n-propoxysilane, diisopropyldiisopropoxysilane, diisopropyl-di-n-butoxysilane, diisopropyl-di-sec-butoxysilane, diisopropyl-di-tert-butoxysilane, diisopropyldiphenoxysilane, di-n-butyldimethoxysilane, di-n-butyldiethoxysilane, di-n-butyl-di-n-propoxysilane, di-n-butyldiisopropoxysilane, di-n-butyl-di-n-butoxysilane, di-n-butyl-di-sec-butoxysilane, di-n-butyl-di-tert-butoxysilane, di-n-butyl-di-phenoxysilane, di-sec-butyldimethoxysilane, di-sec-butyldiethoxysilane, di-sec-butyl-di-n-propoxysilane, di-sec-butyldiisopropoxysilane, di-sec-butyl-di-n-butoxysilane, di-sec-butyl-di-sec-butoxysilane, di-sec-butyl-di-tert-butoxysilane, di-sec-butyl-di-phenoxysilane, di-tert-butyldimethoxysilane, di-tert-butyldiethoxysilane, di-tert-butyldi-n-propoxysilane, di-tert-butyldiisopropoxysilane, di-tert-butyldi-n-butoxysilane, di-tert-butyldi-sec-butoxysilane, di-tert-butyl-di-tert-butoxysilane, di-tert-butyldi-phenoxysilane, vinyltrimethoxysilane, vinyltriethoxysilane, vinyltri-n-propoxysilane, vinyltri-iso-propoxysilane, vinyltri-n-butoxysilane, vinyltri-sec-butoxysilane, vinyltri-tert-butoxysilane, vinyltriphenoxysilane, allyltrimethoxysilane, allyltriethoxysilane, allyltri-n-propoxysilane, allyltri-iso-propoxysilane, allyltri-n-butoxysilane, allyltri-sec-butoxysilane, allyltri-tert-butoxysilane, and allyltriphenoxysilane.

Specific examples of the compound (2) shown by of the formula (2) include tetramethoxysilane, tetraethoxysilane, tetra-n-propoxysilane, tetra-iso-propoxysilane, tetra-n-butoxysilane, tetra-sec-butoxysilane, tetra-tert-butoxysilane, and tetraphenoxysilane.

Examples of the compound in which z is zero in the general formula (3) may include: hexamethoxydisilane, hexaethoxydisilane, hexaphenoxydisilane, 1,1,1,2,2-pentamethoxy-2-methyldisilane, 1,1,1,2,2-pentaethoxy-2-methyldisilane, 1,1,1,2,2-pentaphenoxy-2-methyldisilane, 1,1,1,2,2-pentamethoxy-2-ethyldisilane, 1,1,1,2,2-pentaethoxy-2-ethyldisilane, 1,1,1,2,2-pentaphenoxy-2-ethyldisilane, 1,1,1,2,2-pentamethoxy-2-phenyldisilane, 1,1,1,2,2-pentaethoxy-2-phenyldisilane, 1,1,1,2,2-pentaphenoxy-2-phenyldisilane, 1,1,2,2-tetramethoxy-1,2-dimethyldisilane, 1,1,2,2-tetraethoxy-1,2-dimethyldisilane, 1,1,2,2-tetraphenoxy-1,2-dimethyldisilane, 1,1,2,2-tetramethoxy-1,2-diethyldisilane, 1,1,2,2-tetraethoxy-1,2-diethyldisilane, 1,1,2,2-tetraphenoxy-1,2-diethyldisilane, 1,1,2,2-tetramethoxy-1,2-diphenyldisilane, 1,1,2,2-tetraethoxy-1,2-diphenyldisilane, 1,1,2,2-tetraphenoxy-1,2-diphenyldisilane, 1,1,2-trimethoxy-1,2,2-trimethyldisilane, 1,1,2-triethoxy-1,2,2-trimethyldisilane, 1,1,2-triphenoxy-1,2,2-trimethyldisilane, 1,1,2-trimethoxy-1,2,2-triethyldisilane, 1,1,2-triethoxy-1,2,2-triethyldisilane, 1,1,2-triphenoxy-1,2,2-triethyldisilane, 1,1,2-trimethoxy-1,2,2-triphenyldisilane, 1,1,2-triethoxy-1,2,2-triphenyldisilane, 1,1,2-triphenoxy-1,2,2-triphenyldisilane, 1,2-dimethoxy-1,1,2,2-tetramethyldisilane, 1,2-diethoxy-1,1,2,2-tetramethyldisilane, 1,2-diphenoxy-1,1,2,2-tetramethyldisilane, 1,2-dimethoxy-1,1,2,2-tetraethyldisilane, 1,2-diethoxy-1,1,2,2-tetraethyldisilane, 1,2-diphenoxy-1,1,2,2-tetraethyldisilane, 1,2-dimethoxy-1,1,2,2-tetraphenyldisilane, 1,2-diethoxy-1,1,2,2-tetraphenyldisilane, and 1,2-diphenoxy-1,1,2,2-tetraphenyldisilane.

Examples of the compound (3) of the general formula (3) in which z is 1 may include: bis(trimethoxysilyl)methane, bis(triethoxysilyl)methane, bis(tri-n-propoxysilyl)methane, bis(tri-iso-propoxysilyl)methane, bis(tri-n-butoxysilyl)methane, bis(tri-sec-butoxysilyl)methane, bis(tri-tert-butoxysilyl)methane, 1,2-bis(trimethoxysilyl)ethane, 1,2-bis(triethoxysilyl)ethane, 1,2-bis(tri-n-propoxysilyl)ethane, 1,2-bis(tri-iso-propoxysilyl)ethane, 1,2-bis(tri-n-butoxysilyl)ethane, 1,2-bis(tri-sec-butoxysilyl)ethane, 1,2-bis(tri-tert-butoxysilyl)ethane, 1-(dimethoxymethylsilyl)-1-(trimethoxysilyl)methane, 1-(diethoxymethylsilyl)-1-(triethoxysilyl)methane, 1-(di-n-propoxymethylsilyl)-1-(tri-n-propoxysilyl)methane, 1-(di-iso-propoxymethylsilyl)-1-(tri-iso-propoxysilyl)methane, 1-(di-n-butoxymethylsilyl)-1-(tri-n-butoxysilyl)methane, 1-(di-sec-butoxymethylsilyl)-1-(tri-sec-butoxysilyl)methane, 1-(di-tert-butoxymethylsilyl)-1-(tri-tert-butoxysilyl)methane, 1-(dimethoxymethylsilyl)-2-(trimethoxysilyl)ethane, 1-(diethoxymethylsilyl)-2-(triethoxysilyl)ethane, 1-(di-n-propoxymethylsilyl)-2-(tri-n-propoxysilyl)ethane, 1-(di-iso-propoxymethylsilyl)-2-(tri-iso-propoxysilyl)ethane, 1-(di-n-butoxymethylsilyl)-2-(tri-n-butoxysilyl)ethane, 1-(di-sec-butoxymethylsilyl)-2-(tri-sec-butoxysilyl)ethane, 1-(di-tert-butoxymethylsilyl)-2-(tri-tert-butoxysilyl)ethane, bis(dimethoxymethylsilyl)methane, bis(diethoxymethylsilyl)methane, bis(di-n-propoxymethylsilyl)methane, bis(di-iso-propoxymethylsilyl)methane, bis(di-n-butoxymethylsilyl)methane, bis(di-sec-butoxymethylsilyl)methane, bis(di-tert-butoxymethylsilyl)methane, 1,2-bis(dimethoxymethylsilyl)ethane, 1,2-bis(diethoxymethylsilyl)ethane, 1,2-bis(di-n-propoxymethylsilyl)ethane, 1,2-bis(di-iso-propoxymethylsilyl)ethane, 1,2-bis(di-n-butoxymethylsilyl)ethane, 1,2-bis(di-sec-butoxymethylsilyl)ethane, 1,2-bis(di-tert-butoxymethylsilyl)ethane, 1,2-bis(trimethoxysilyl)benzene, 1,2-bis(triethoxysilyl)benzene, 1,2-bis(tri-n-propoxysilyl)benzene, 1,2-bis(tri-iso-propoxysilyl)benzene, 1,2-bis(tri-n-butoxysilyl)benzene, 1,2-bis(tri-sec-butoxysilyl)benzene, 1,2-bis(tri-tert-butoxysilyl)benzene, 1,3-bis(trimethoxysilyl)benzene, 1,3-bis(triethoxysilyl)benzene, 1,3-bis(tri-n-propoxysilyl)benzene, 1,3-bis(tri-iso-propoxysilyl)benzene, 1,3-bis(tri-n-butoxysilyl)benzene, 1,3-bis(tri-sec-butoxysilyl)benzene, 1,3-bis(tri-tert-butoxysilyl)benzene, 1,4-bis(trimethoxysilyl)benzene, 1,4-bis(triethoxysilyl)benzene, 1,4-bis(tri-n-propoxysilyl)benzene, 1,4-bis(tri-iso-propoxysilyl)benzene, 1,4-bis(tri-n-butoxysilyl)benzene, 1,4-bis(tri-sec-butoxysilyl)benzene, and 1,4-bis(tri-tert-butoxysilyl)benzene.

Figure 13:
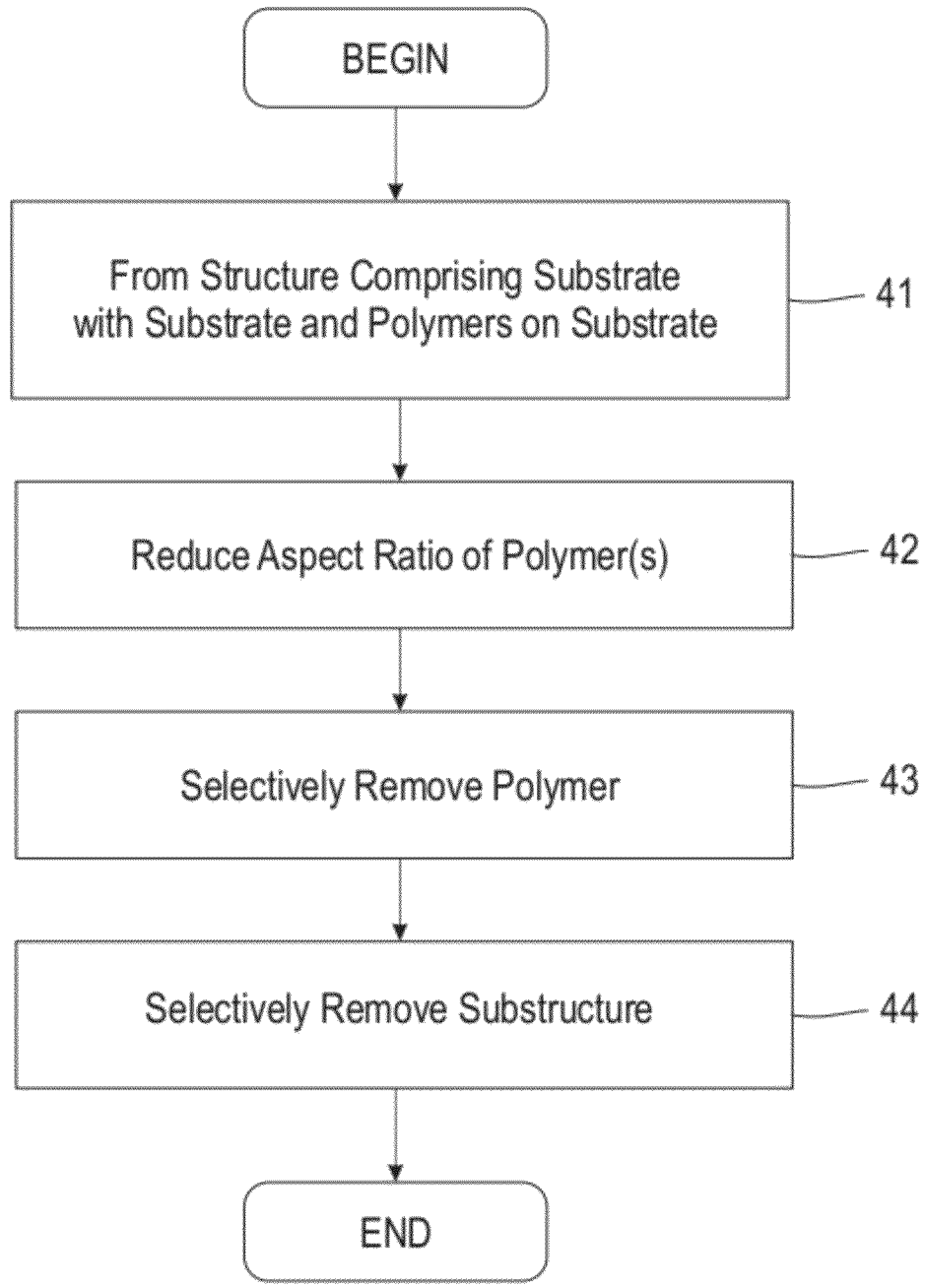
FIG. 13 is a flow chart describing a method for processing a structure, in accordance with embodiments of the present invention.

FIG. 13 is a flow chart describing a method for processing structures, in accordance with embodiments of the present invention. The method of FIG. 13 includes steps 41-44.

Step 41 forms a structural configuration that comprises a substrate, a substructure having a sidewall and disposed on an external surface of the substrate, a first polymer structure disposed on the external surface of the substrate and in direct mechanical contact with the sidewall, and a second polymer structure disposed on the external surface of the substrate and in direct mechanical contact with the first polymer structure such that the first polymer structure is disposed between the sidewall and the second polymer structure. The first polymer structure comprises a first polymer and the second polymer structure comprises a second polymer. The substructure, first polymer structure, and second polymer structure are in direct mechanical contact with the external surface of the substrate. Step 41 may be performed in accordance with the method described infra in FIG. 14. In one embodiment for the structural configuration formed in step 41 as illustrated in FIGS. 1C, 6B, 6C, 6D, 10A, and 11A, (i) a top surface of the substructure, a top surface of the first polymer structure, and a top surface of the second polymer structure is at a further perpendicular distance from the external surface of the substrate than is any other surface of the substructure, the first polymer structure, and the second polymer structure, respectively, (ii) the top surface of the substructure is at a further perpendicular distance from the external surface of the substrate than is the top surface of the first polymer structure and the top surface of the second polymer structur3, and (iii) the top surface of the substructure, the top surface of the first polymer structure, and the top surface of the second polymer structure are each parallel to the external surface of the substrate.

Step 42 reduces an aspect ratio of each polymer structure of at least one polymer structure with respect to the external surface of the substrate. Said reducing comprises removing an upper portion furthest from the substrate of each polymer structure of the at least one polymer structure. The at least one polymer structure is selected from the group consisting of the first polymer structure, the second polymer structure, and both the first polymer structure and the second polymer structure. In one embodiment, the at least one polymer structure is the first polymer structure or the second polymer structure. In one embodiment, the at least one polymer structure is the first polymer structure and the second polymer structure.

Step 43 selectively removes one polymer structure from the structural configuration such that a remaining polymer structure remains disposed on the external surface of the substrate after the one polymer structure has been selectively removed. Either the selectively removed one polymer structure is the first polymer structure and the remaining polymer structure is the second polymer structure or the selectively removed one polymer structure is the second polymer structure and the remaining polymer structure is the first polymer structure. Regardless of which polymer structure is selectively removed, the remaining polymer structure should have had its aspect ratio reduced in the slimming step 42.

In a first embodiment of the method of FIG. 13, the selectively removed one polymer structure is the second polymer structure and the remaining polymer structure is the first polymer structure, wherein the method further comprises: selectively removing the substructure such that the remaining polymer structure remains disposed on the external surface of the substrate after the substructure has been selectively removed, as depicted after the second selective removal in FIGS. 6B, 6C, and 6D.

In a first aspect of the preceding first embodiment corresponding to the "slimming first" of FIG. 6B, said reducing the aspect ratio is performed before said selectively removing one polymer structure is performed and before said selectively removing the substructure is performed, wherein either said selectively removing the substructure is performed before said selectively removing one polymer structure is performed or said selectively removing one polymer structure is performed before said selectively removing the substructure is performed.

In a second aspect of the preceding first embodiment corresponding to the "slimming between" of FIG. 6C, said selectively removing the substructure is performed before said reducing the aspect ratio is performed, and said reducing the aspect ratio is performed before said removing one polymer structure is performed.

In a third aspect of the preceding first embodiment corresponding to the "slimming together" of FIG. 6D, said selectively removing the substructure is performed before said reducing the aspect ratio is performed and before said removing one polymer structure is performed, and said reducing the aspect ratio and said removing one polymer structure are performed simultaneously.

In a second embodiment of the method of FIG. 13, the selectively removed one polymer structure is the first polymer structure and the remaining polymer structure is the second polymer structure, and wherein the method further comprises: selectively removing the substructure such that the remaining polymer structure remains disposed on the external surface of the substrate after the substructure has been selectively removed, as depicted in FIGS. 7B, 7C, and 7D.

In a first aspect of the preceding second embodiment corresponding to the "slimming first" of FIG. 7B, said reducing the aspect ratio is performed before said selectively removing one polymer structure is performed and before said selectively removing the substructure is performed, wherein either said selectively removing the substructure is performed before said selectively removing one polymer structure is performed or said selectively removing one polymer structure is performed before said selectively removing the substructure is performed.

In a second aspect of the preceding second embodiment corresponding to the "slimming between" of FIG. 7C, said selectively removing the substructure is performed before said reducing the aspect ratio is performed, and said reducing the aspect ratio is performed before said removing one polymer structure is performed.

In a third aspect of the preceding second embodiment corresponding to the "slimming together" of FIG. 7D, said selectively removing the substructure is performed before said reducing the aspect ratio is performed and before said removing one polymer structure is performed, and said reducing the aspect ratio and said removing one polymer structure are performed simultaneously.

In a third embodiment of the method of FIG. 13, the selectively removed one polymer structure is the second polymer structure and the remaining polymer structure is the first polymer structure, wherein the substructure remains disposed on the external surface of the substrate after the one polymer structure has been selectively removed, as depicted in FIGS. 8B, 8C, and 8D.

In a first aspect of the preceding third embodiment corresponding to the "slimming first or "slimming between" of FIG. 8B or 8C, respectively, said reducing the aspect ratio is performed before said selectively removing one polymer structure is performed.

In a second aspect of the preceding third embodiment corresponding to the "slimming together" of FIG. 8D, said reducing the aspect ratio and said removing one polymer structure are performed simultaneously.

In a fourth embodiment of the method of FIG. 13, the selectively removed one polymer structure is the first polymer structure and the remaining polymer structure is the second polymer structure, and wherein the substructure remains disposed on the external surface of the substrate after the one polymer structure has been selectively removed, as depicted in FIGS. 9B, 9C, and 9D.

In a first aspect of the preceding fourth embodiment corresponding to the "slimming first or "slimming between" of FIG. 9B or 9C, respectively, said reducing the aspect ratio is performed before said selectively removing one polymer structure is performed.

In a second aspect of the preceding fourth embodiment corresponding to the "slimming together" of FIG. 9D said reducing the aspect ratio and said removing one polymer structure are performed simultaneously.

Figure 14:
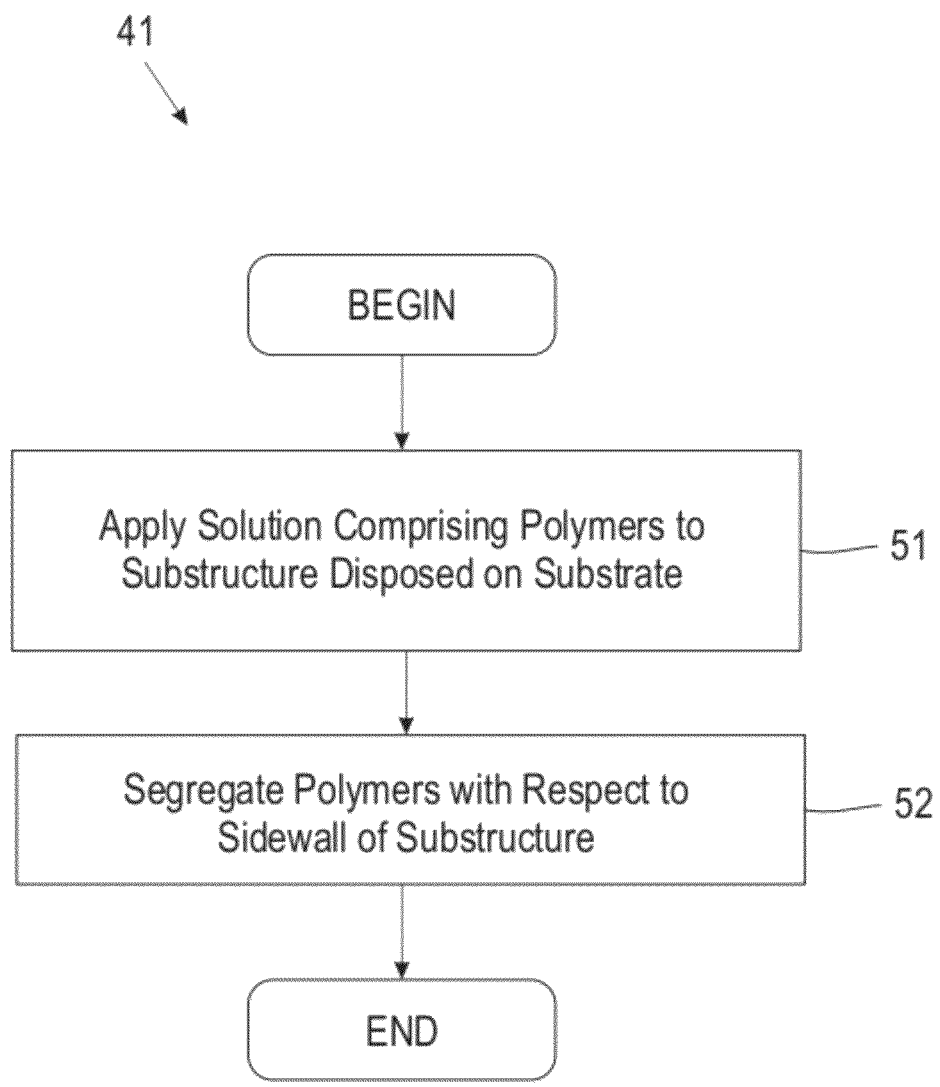
FIG. 14 is a flow chart describing a method for implementing the step of forming the structure in FIG. 13, in accordance with embodiments of the present invention.

FIG. 14 is a flow chart describing a method for forming the structural configuration in step 41 of FIG. 13, in accordance with embodiments of the present invention. The method of FIG. 13 includes steps 51-52.

Step 51 applies a solution comprising the first polymer and the second polymer to the substructure disposed on and in direct mechanical contact with the substrate. The sidewall comprises a first material. A selective chemical affinity of the first polymer for the first material is greater than a selective chemical affinity of the second polymer for the first material.

Step 52 segregates the first polymer from the second polymer, wherein the first polymer selectively segregates to the sidewall resulting in the first polymer being disposed between the sidewall and the second polymer to form the structure in step 41 of FIG. 13.

EXAMPLE 4

Slimming First Scheme

Figure 10A:
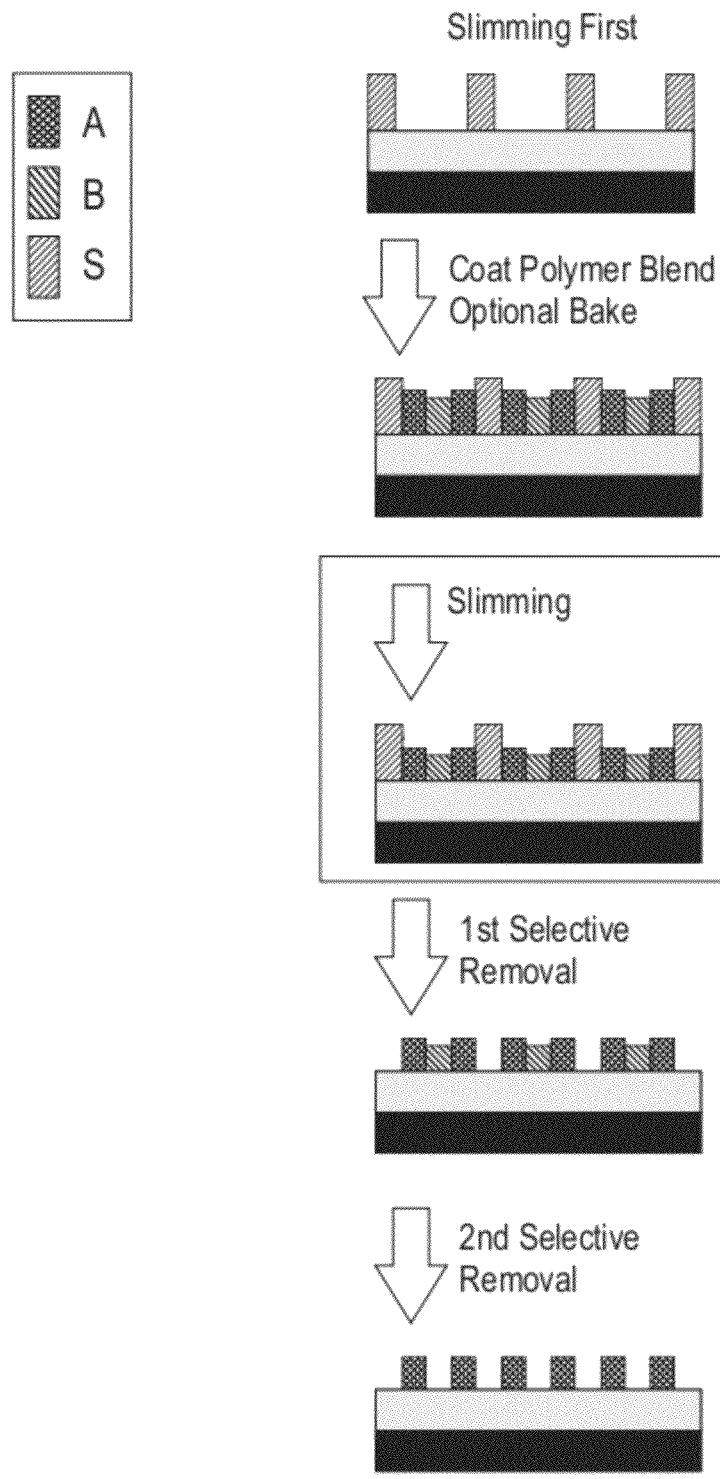
FIG. 10A shows the "slimming first" scheme of FIG. 6B, in accordance with embodiments of the present invention.

FIG. 10A shows the slimming first scheme of FIG. 6B, in accordance with embodiments of the present invention. The topographical guiding structures for the polymer blend are AR2928JN (JSR) resist patterns on ARC29A (Brewer Science) with 110 nm half-pitch and 130 nm film thickness. The patterned substrates are flood exposed using broad band UV with a dose of 100 mJ/cm² and then baked at 115° C. for 60 seconds and 185° C. for 120 seconds to switch the polarity of the resist and harden the resist to PGMEA. A 1.5 wt % PGMEA solution of AcOMBS (poly(1-(4-acetoxyphenyl) ethyl silesquioxane)) and PS (polystyrene, 22k) with the weight ratio of 50:50 was spin-cast on the treated resist substructure S (see FIG. 4A) at 3000 rpm for 30 seconds and then baked at 100° C. for 60 seconds and the polymer blend to form segregated structures within the resist trench. AcOMBS (polymer A—see FIG. 4A) segregates to the sidewall of the resist features and PS (polymer B—see FIG. 4A) segregates to the center of the trench. The slimming process is applied before development of resist and PS. In the slimming step, the sample is dipped in the slimming solvent for 60 seconds. The slimming step is stopped by rinsing the sample with water (a non-solvent for treated resist, PS and AcOMBS). After rinse, the sample is spin-dried. After the slimming process, the treated resist features were selectively removed by 0.26N TMAH, and PS was selectively removed by cyclohexane. With proper slimming solvent, the pattern profile of AcOMBS is improved and pattern collapse is reduced.

Figure 10B:
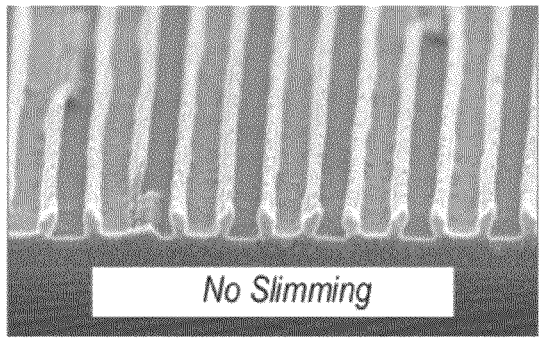
FIG. 10B is the cross-section SEM images of the AcOMBS lines formed using the reference process shown in FIG. 6A, in accordance with embodiments of the present invention.

FIG. 10B is the cross-section SEM images of the AcOMBS lines formed using the reference process shown in FIG. 6A, in accordance with embodiments of the present invention. The depicted AcOMBS lines pertain to after selective removal of the resist and PS without the slimming process. Some AcOMBS lines collapse and other AcOMBS lines do not form perpendicular to the substrate and bend toward the space which was occupied by the treated resist.

Figure 10E:
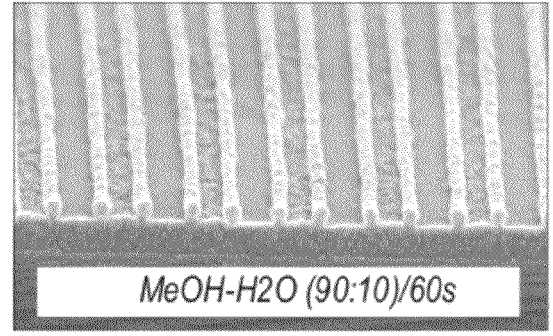
FIGS. 10C to 10G are the cross-section SEM images of the final AcOMBS lines formed using the "slimming first" scheme in FIG. 10A, in accordance with embodiments of the present invention.
Figure 10C:
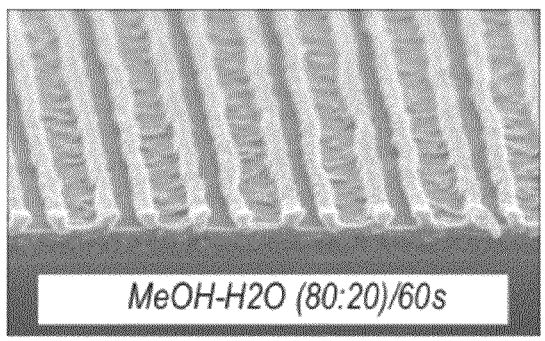
Figure 10F:
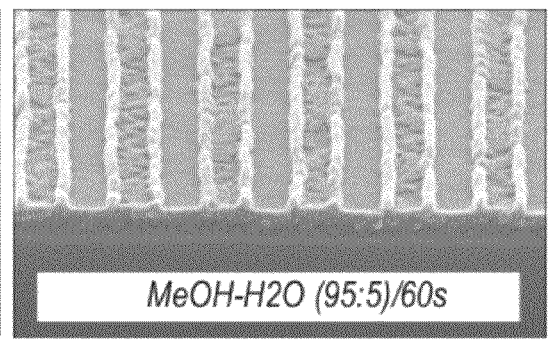
Figure 10D:
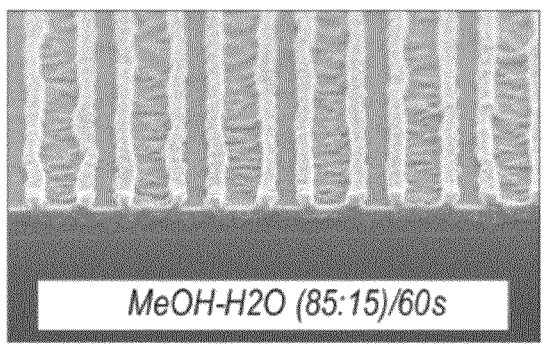
Figure 10G:
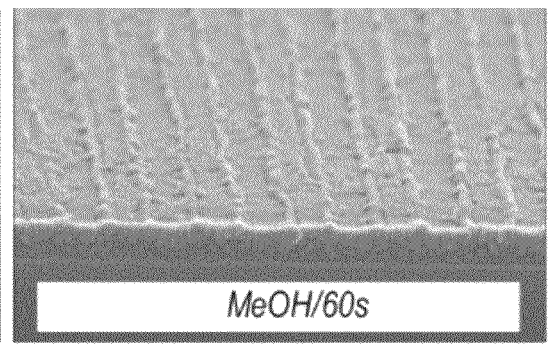

FIGS. 10C to 10G are the cross-section SEM images of the final AcOMBS lines formed using the slimming first scheme in FIG. 10A, in accordance with embodiments of the present invention. Various slimming solvents are used for slimming process. Methanol is a good solvent for AcOMBS, a poor solvent for the treated resist, and a non-solvent for PS and resist features. A mixture of methanol (MeOH) and water is used to show the slimming results. Water is a non-solvent for treated resist, PS and AcOMBS. A mixture solvent of MeOH and water gives a range of solvent properties as a function of mixing ratio. Mixture solvents of MeOH:H2O=80:20 (wt/wt) and MeOH:H2O=80:20 (wt/wt) reduce the aspect ratio of the AcOMBS lines but do not completely correct the bending of the AcOMBS lines as shown in FIG. 10C and FIG. 10D. A mixture solvent of MeOH:H2O=90:10 (wt/wt) reduces the aspect ratio of AcOMBS lines and render vertical sidewalls of AcOMBS lines (FIG. 10E). If MeOH content is further increased in the mixture solvent, the solubility of AcOMBS lines in the solvent become too high for the slimming purpose. For example, the larger thickness variation in AcOMBS lines is observed after applying a slimming solvent of MeOH: H2O=95:5 (wt/wt) as shown in FIG. 10F. FIG. 10G shows almost all of the AcOMBS lines are dissolved in a slimming solvent using MeOH alone.

EXAMPLE 5

Slimming Between Scheme

Figure 11A:
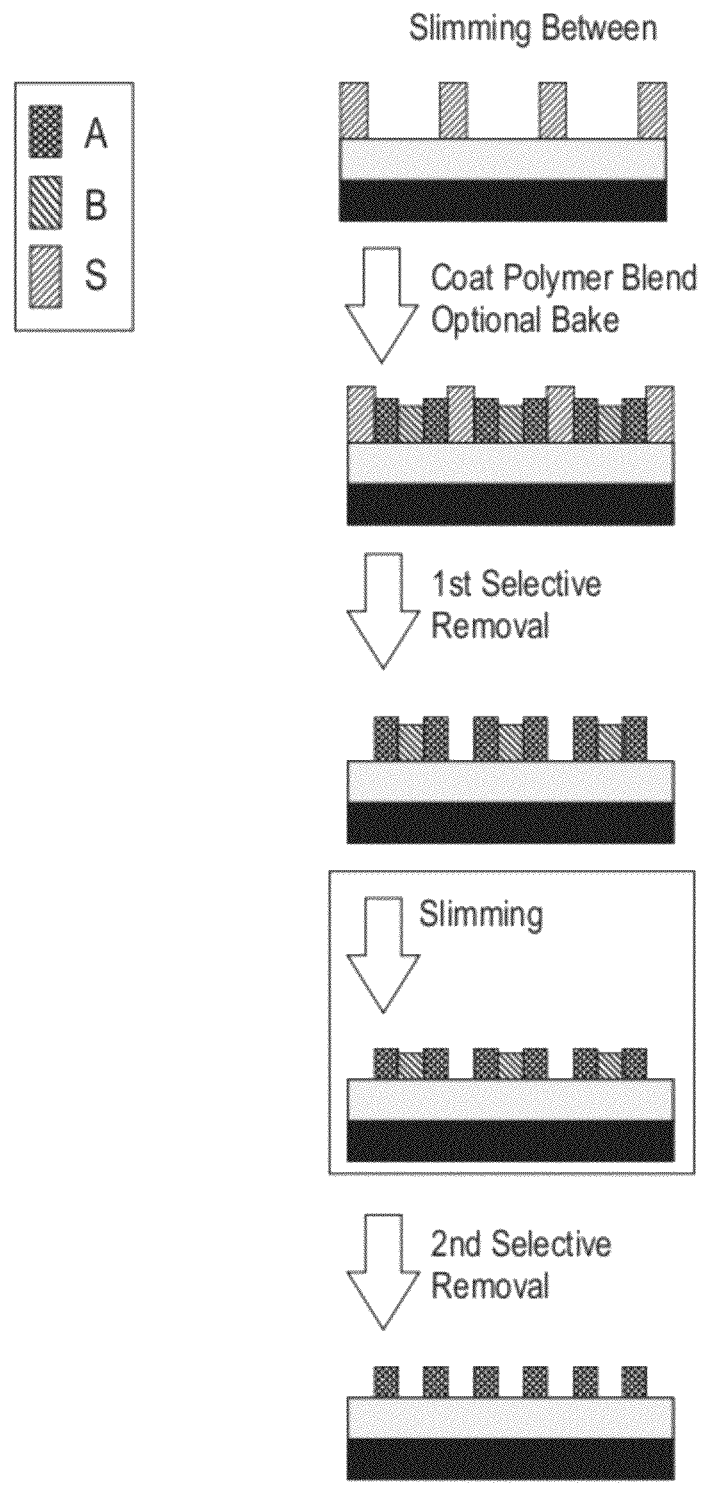
FIG. 11A shows the "slimming between" scheme of FIG. 6C, in accordance with embodiments of the present invention.

FIG. 11A shows the slimming between scheme of FIG. 6C, in accordance with embodiments of the present invention. The topographical guiding structures for polymer blend are AR2928JN (JSR) resist patterns on ARC29 (Brewer Science) with 110 nm half-pitch and 130 nm film thickness. The patterned substrates are flood exposed using broad band UV with a dose of 100 mJ/cm² and then baked at 115° C. for 60 seconds and 185° C. for 120 seconds to switch the polarity of the resist and harden the resist to PGMEA. A 1.5 wt % PGMEA solution of AcOMBS and PS (polystyrene, 22k) with the weight ratio of 50:50 was spin-cast on the treated resist substructure S (see FIG. 4A) at 3000 rpm for 30 seconds and then baked at 100° C. for 60 seconds and to form segregated structures within resist trench. AcOMBS (polymer A—see FIG. 4A) segregates to the sidewall of the resist features and PS (polymer B—FIG. 4A) segregates to the center of the trench. After segregation, the treated resist features were selectively removed by 0.26N TMAH. The slimming process is applied in between the development of resist and development of PS. In the slimming step, the sample is dipped in the slimming solvent for 60 seconds. The slimming step is stopped by rinsing the sample with water (a non-solvent for treated resist, PS and AcOMBS). After rinse, the sample is spin-dried. After the slimming process, PS is selectively removed by cyclohexane. With proper slimming solvent, the pattern profile of AcOMBS is improved and pattern collapse is reduced.

Figure 11B:
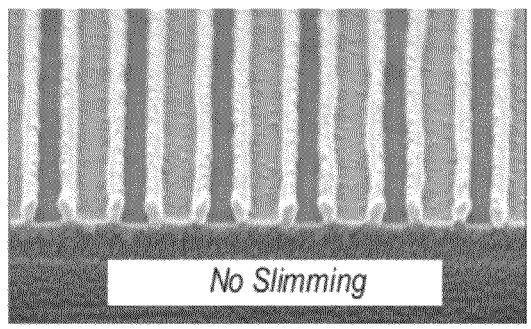
FIGS. 11B and 11E shows cross-section SEM images of 100K and 20K magnification, respectively, of the AcOMBS lines formed using the reference process shown in FIG. 6A (i.e., without slimming), in accordance with embodiments of the present invention. Some AcOMBS lines collapse and other AcOMBS lines do not form perpendicular to the substrate and bend toward the space which was occupied by the substructure.
Figure 11E:
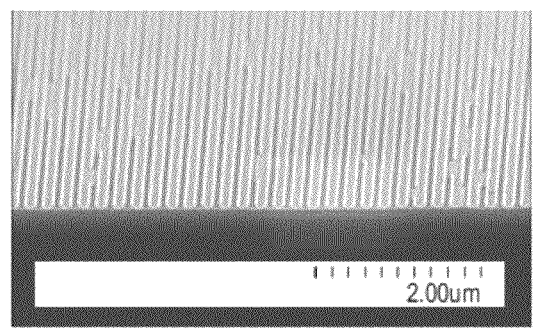

FIGS. 11B and 11E shows cross-section SEM images of 100K and 20K magnification, respectively, of the AcOMBS lines formed using the reference process shown in FIG. 6A, in accordance with embodiments of the present invention. The depicted AcOMBS lines pertain to after selective removal of the resist and PS without the slimming process. Some AcOMBS lines collapse and other AcOMBS lines do not form perpendicular to the substrate and bend toward the space which was occupied by the treated resist.

Figure 11C:
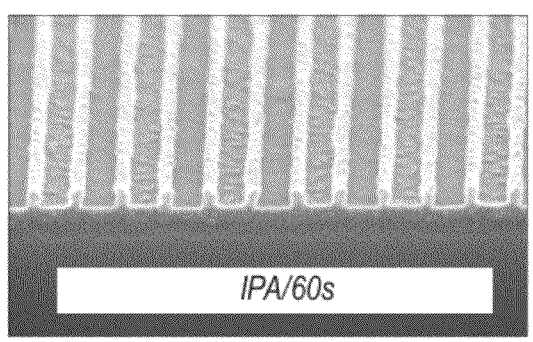
FIG. 11C and FIG. 11F shows cross-section SEM images of 100K and 20K magnification, respectively, of the AcOMBS lines for the "slimming between" scheme of FIG. 11A using IPA as a slimming solvent, in accordance with embodiments of the present invention.
Figure 11F:
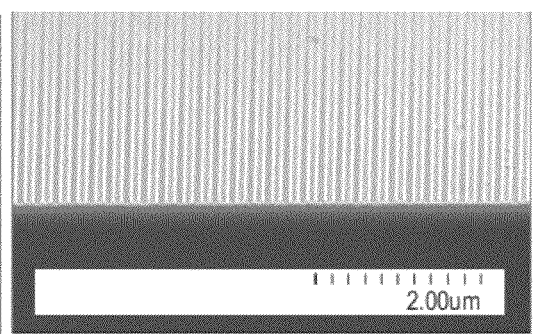

FIG. 11C and FIG. 11F shows cross-section SEM images of 100K and 20K magnification, respectively, of the AcOMBS lines for the slimming between scheme of FIG. 11A using IPA as a slimming solvent, in accordance with embodiments of the present invention. The depicted AcOMBS lines pertain to after (i) selective removal of resist line, (ii) slimming process and then (iii) selective removal of resist and PS features. Two different slimming solvents are used for slimming process. IPA is used as a slimming solvent and reduces aspect ratio of the AcOMBS lines, but there are still few spots with collapse lines in the 20K magnification SEM image. No pattern collapse is observed in the 20K magnification SEM.

Figure 11D:
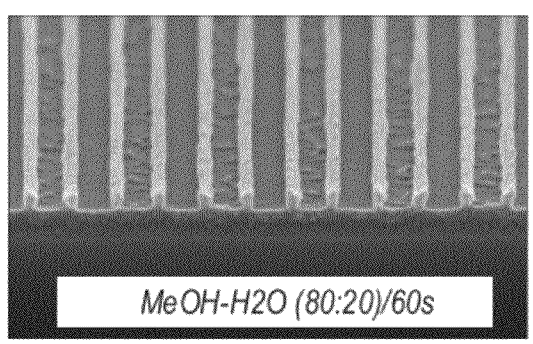
FIG. 11D and FIG. 11G shows cross-section SEM images of 100K and 20K magnification, respectively, of the AcOMBS lines for the "slimming between" scheme of FIG. 11A using a mixture solvent of MeOH:H2O=80:20, in accordance with embodiments of the present invention.
Figure 11G:
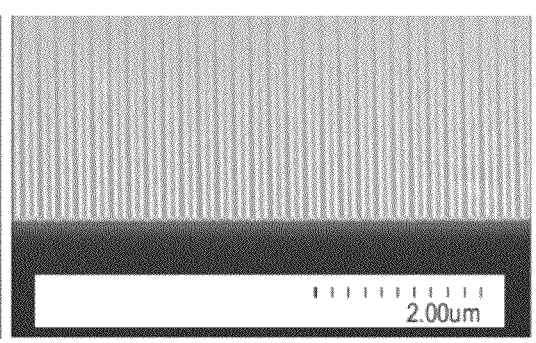

FIG. 11D and FIG. 11G shows cross-section SEM images of 100K and 20K magnification, respectively, of the AcOMBS lines for the slimming between scheme of FIG. 11A using a mixture solvent of MeOH:H2O=80:20, in accordance with embodiments of the present invention. The depicted AcOMBS lines pertain to after (i) selective removal of resist line, (ii) slimming process and then (iii) selective removal of resist and PS features. Two different slimming solvents are used for slimming process. A mixture solvent of MeOH:H2O=80:20 (wt/wt) reduces aspect ratio of AcOMBS lines and renders vertical sidewalls of AcOMBS lines. No pattern collapse is observed in the 20K magnification SEM.

EXAMPLE 6

Slimming Together Scheme

Figure 12A:
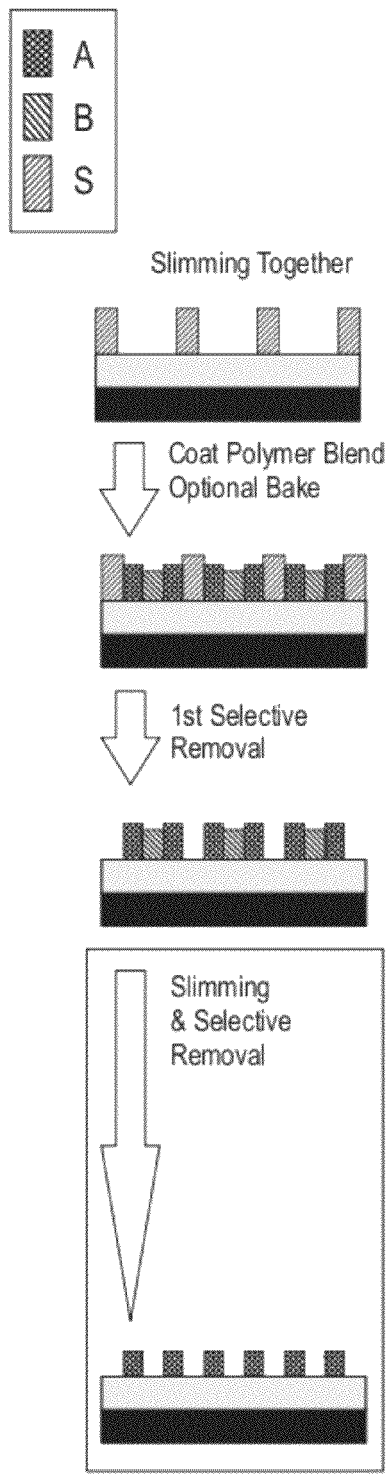
FIG. 12A shows the "slimming together" scheme of FIG. 6D, in accordance with embodiments of the present invention.

FIG. 12A shows the slimming together scheme of FIG. 6D, in accordance with embodiments of the present invention. The topographical guiding structures for polymer blend are AR2928JN (JSR) resist patterns on ARC29 (Brewer Science) with 110 nm half-pitch and 130 nm film thickness. The patterned substrates are flood exposed using broad band UV with a dose of 100 mJ/cm$^2$ and then baked at 115° C. for 60 seconds and 185° C. for 120 seconds to switch the polarity of the resist and harden the resist to PGMEA. A 1.5 wt % PGMEA solution of AcOMBS and PS (polystyrene, 22k) with the weight ratio of 50:50 was spin casted on the treated resist substructure S (see FIG. 4A) at 3000 rpm for 30 seconds and then baked at 100° C. for 60 seconds and the polymer blend to form segregated structures within resist trench. AcOMBS (polymer A—see FIG. 4A) segregates to the sidewall of the resist features and PS (polymer B—see FIG. 4A) segregates to the center of the trench. After segregation, the treated resist features were selectively removed by 0.26N TMAH. The slimming process is applied together with the development of PS. In the slimming/development step, the sample is dipped in the slimming/developing solvent for 60 seconds. The slimming/development step is stopped by rinsing the sample with water (a non-solvent for treated resist, PS and AcOMBS). After rinse, the sample is spin-dried. With proper slimming/development solvent, the pattern profile of AcOMBS is improved and pattern collapse is reduced.

Figure 12B:
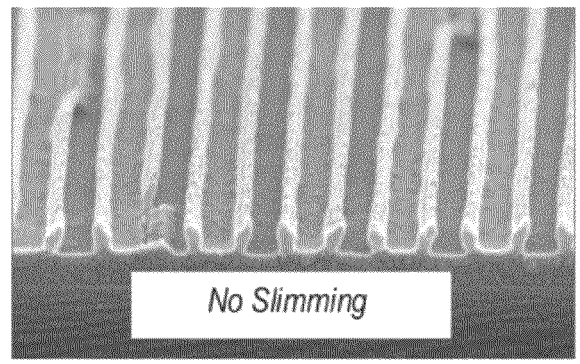
FIG. 12B shows cross-section SEM images of AcOMBS lines formed using the reference process shown in FIG. 6A (i.e., without slimming), in accordance with embodiments of the present invention.

FIG. 12B shows cross-section SEM images of AcOMBS lines formed using the reference process shown in FIG. 6A after selective removal of the resist and PS without the slimming process, in accordance with embodiments of the present invention. Some AcOMBS lines collapse and other AcOMBS lines do not form perpendicular to the substrate and bend toward the space which was occupied by the treated resist.

Figure 12C:
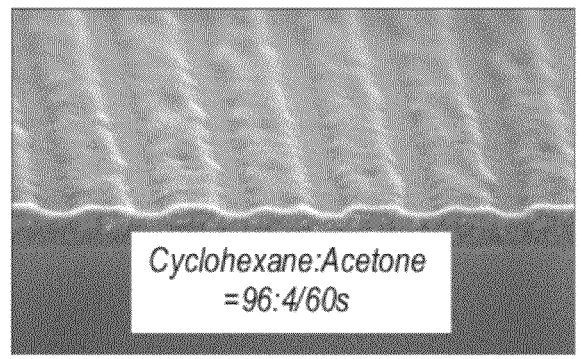
FIG. 12C shows cross-section SEM images of AcOMBS lines after selective removal of the substructure followed by a slimming/developing step of FIG. 12A using a mixture solvent of cyclohexane:acetone=96:4 (wt/wt), in accordance with embodiments of the present invention.

FIG. 12C shows cross-section SEM images of AcOMBS lines after selective removal of resist line followed by a slimming/developing step of FIG. 12A using a mixture solvent of cyclohexane:acetone=96:4 (wt/wt), in accordance with embodiments of the present invention. The AcOMBS lines completely collapsed on the substrate. This mixture solvent swells AcOMBS and does not remove AcOMBS cleanly.

Figure 12D:
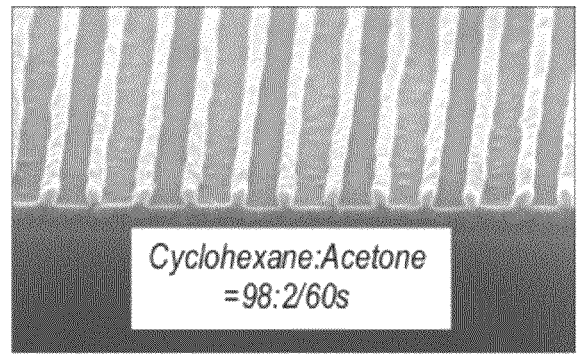
FIG. 12D shows cross-section SEM images of AcOMBS lines after selective removal of the substructure followed by a slimming/developing step of FIG. 12A using a mixture solvent of cyclohexane:acetone=98:2 (wt/wt), in accordance with embodiments of the present invention.

FIG. 12D shows cross-section SEM images of AcOMBS lines after selective removal of resist line followed by a slimming/developing step of FIG. 12A using a mixture solvent of cyclohexane:acetone=98:2 (wt/wt), in accordance with embodiments of the present invention. The aspect ratio of the AcOMBS line is reduced and no pattern collapse of AcOMBS lines is observed.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A method for processing structures, said method comprising:

disposing a substructure on an external surface of a substrate, wherein the substructure comprises a sidewall that is perpendicular to the external surface of the substrate;

after said disposing the substructure on the external surface of the substrate, forming a structural configuration, said forming the structural configuration comprising forming a first polymer structure disposed on the external surface of the substrate and in direct mechanical contact with the sidewall and forming a second polymer structure disposed on the external surface of the substrate and in direct mechanical contact with the first polymer structure such that the first polymer structure is disposed between the sidewall and the second polymer structure, said first polymer structure comprising a first polymer, said second polymer structure comprising a second polymer, wherein there is no overlap among the substructure, the first polymer structure, and the second polymer structure in a first direction perpendicular to the external surface of the substrate;

after said forming the structural configuration, reducing an aspect ratio of at least one polymer structure with respect to the external surface of the substrate, said reducing comprising removing an upper portion furthest from the substrate of said at least one polymer structure, said at least one polymer structure being the first polymer structure, the second polymer structure, or both the first polymer structure and the second polymer structure; and after said forming the structural configuration, selectively and totally removing one polymer structure from the structural configuration such that a remaining polymer structure remains disposed on the external surface of the substrate after the one polymer structure has been selectively and totally removed, said reducing having reduced the aspect ratio of the remaining polymer structure, wherein said selectively removing the one polymer structure is selective with respect to the remaining polymer structure, wherein either the selectively and totally removed one polymer structure is the first polymer structure and the remaining polymer structure is the second polymer structure or the selectively and total removed one polymer structure is the second polymer structure and the remaining polymer structure is the first polymer structure, wherein prior to initiation of said reducing and prior to initiation of said selectively removing and after the structural configuration has been completely formed from said forming the structural configuration: (i) a top surface of the substructure, a top surface of the first polymer structure, and a top surface of the second polymer structure is at a further perpendicular distance from the external surface of the substrate than is any other surface of the substructure, the first polymer structure, and the second polymer structure, respectively, (ii) the top surface of the substructure is at a further perpendicular distance from the external surface of the substrate than is the top surface of the first polymer structure and the top surface of the second polymer structure, and (iii) the top surface of the substructure, the top surface of the first polymer structure, and the top surface of the second polymer structure are each parallel to the external surface of the substrate.

2. The method of claim 1, wherein the selectively removed one polymer structure is the second polymer structure and the remaining polymer structure is the first polymer structure, and wherein the method further comprises:
selectively removing the substructure such that the remaining polymer structure remains disposed on the external surface of the substrate after the substructure has been selectively removed.

3. The method of claim 2, wherein said reducing the aspect ratio is performed after said selectively removing the substructure is performed and before said removing one polymer structure is performed.

4. The method of claim 2, wherein said selectively removing the substructure is performed before said reducing the aspect ratio is performed and before said removing one polymer structure is performed, and wherein said reducing the aspect ratio and said removing one polymer structure are performed simultaneously.

5. The method of claim 1, wherein the selectively removed one polymer structure is the first polymer structure and the remaining polymer structure is the second polymerstructure, and wherein the method further comprises:
selectively removing the substructure such that the remaining polymer structure remains disposed on the external surface of the substrate after the substructure has been selectively removed.

6. The method of claim 5, wherein said reducing the aspect ratio is performed before said selectively removing one polymer structure is performed and before said selectively removing the substructure is performed, and wherein either: i) said selectively removing the substructure is performed before said selectively removing one polymer structure is performed or ii) said selectively removing one polymer structure is performed before said selectively removing the substructure is performed.

7. The method of claim 5, wherein said reducing the aspect ratio is performed after said selectively removing the substructure is performed and before said removing one polymer structure is performed.

8. The method of claim 5, wherein said selectively removing the substructure is performed before said reducing the aspect ratio is performed and before said removing one polymer structure is performed, and wherein said reducing the aspect ratio and said removing one polymer structure are performed simultaneously.

9. The method of claim 1, wherein the selectively removed one polymer structure is the second polymer structure and the remaining polymer structure is the first polymer structure, and wherein the substructure remains disposed on the external surface of the substrate after the one polymer structure has been selectively removed.

10. The method of claim 9, wherein said reducing the aspect ratio is performed before said selectively removing one polymer structure is performed.

11. The method of claim 9, wherein said reducing the aspect ratio and said removing one polymer structure are performed simultaneously.

12. The method of claim 1, wherein the selectively removed one polymer structure is the first polymer structure and the remaining polymer structure is the second polymer structure, and wherein the substructure remains disposed on the external surface of the substrate after the one polymer structure has been selectively removed.

13. The method of claim 12, wherein said reducing the aspect ratio is performed before said selectively removing one polymer structure is performed.

14. The method of claim 12, wherein said reducing the aspect ratio and said removing one polymer structure are performed simultaneously.

15. The method of claim 1, wherein said at least one polymer structure whose aspect ratio is reduced by said reducing is the first polymer structure or the second polymer structure.

16. The method of claim 1, wherein said at least one polymer structure whose aspect ratio is reduced by said reducing is the first polymer structure and the second polymer structure.

17. The method of claim 1, wherein said first and second polymers are each selected from the group consisting of cellulose, poly(acrylamide), polyethyleneimine, poly(acrylic acid), poly(2-ethyl-2-oxazoline), poly(ethyleneoxide), and poly(vinyl alcohol), novolac resins, cresol resins, poly(hydroxystyrene), poly(acrylic acid), poly(styrene sulfonic acid), poly(vinyl phosphoric acid), poly(vinyl sulfonic acid), poly(2-sulfoethyl methacrylate), poly(2-sulfopropyldimethyl-3-methacrylamide), poly(1,1,1-trifluoro-2-(trifluoromethyl)-2-hydroxy-pentan-4-ylmethacrylate), fluoroalcohol-based polymers, poly(2-ethyl-trifluoromethanesulfonamide methacrylate),acidic sulfonamide polymers, poly(styrene), poly(hydroxyadamantyl methacrylate), poly(isobornyl methacrylate), poly(phenyl methacrylate), poly(vinyl naphthalene), polysiloxanes, polymethylsilsesquioxanes, polycarbosilanes, poly(vinyl ferrocene), poly(acylonitrile), poly(caprolactone), poly(lactide), poly(methyl methacrylate), poly(2-hydroxyethyl methacrylate), poly(gamma-butyrolactone methacrylate), poly(tetrahydrofuranyl methacrylate), poly(tetrahydropyranyl methacrylate), poly(allyl amine), poly(4-aminostyrene), poly(2-dimethylaminoethyl methacrylate), polyethyleneneimine, poly(N-methylvinylamine), poly(vinyl pyridine), poly (isoprene), poly(butadiene), poly(nobornene), poly(ethylene), poly(propylene), poly(1,1,1-trifluoro-2-(trifluoromethyl)-2-hydroxy-pentan-4-yl methacrylate), fluoroalcohol-based polymers, poly(2-ethyl-trifluoromethanesulfonamide methacrylate), acidic fluorosulfonamide polymers, poly(2,2,2-trifluoroethyl methacrylate), poly (hexafluoroisopropyl methacrylate), poly(2,3,4,5,6-pentafluorostyrene), and substituted derivatives thereof.

18. The method of claim 1, wherein the first polymer or the second polymer is a silicon-containing polymer having a same structure as is obtained via hydrolysis and condensation of at least one hydrolyzablesilane compound selected from the group coinsisting of a hydrolyzablesilane compound shown by formula (1), a hydrolyzablesilane compound shown by formula (2), and a hydrolyzablesilane compound shown by formula (3):

$$R_a Si(OR^1)_{4-a} \quad (1)$$

wherein R represents a fluorine atom, a linear or branched alkyl group having 1 to 5 carbon atoms, an alkenyl group having 2 to 6 carbon atoms, or an alkylcarbonyloxy group, wherein $R^1$ represents a monovalent organic group, and wherein a represents an integer from 1 to 3;

$$Si(OR^2)_4 \quad (2)$$

wherein $R^2$ represents a monovalent organic group;

$$R^3{}_x (R^4O)^{3-x} Si-(R^7)z-Si(OR^5)_3-yR^6{}_y \quad (3)$$

wherein $R^3$ and $R^6$ independently represent a fluorine atom, an alkylcarbonyloxy group, or a linear or branched alkyl group having 1 to 5 carbon atoms, wherein $R^4$ and $R^5$ independently represent a monovalent organic group, wherein x and y independently represent a number from 0 to 2, wherein $R^7$ represents an oxygen atom, a phenylene group, or a group —$(CH_2)_m$—, wherein m represents an integer from 1 to 6, and wherein z represents 0 or 1.

19. The method of claim 1, further comprising transferring a pattern comprising the remaining polymer structure into the substrate.

20. The method of claim 1, wherein said forming the structural configuration comprises:
applying a solution comprising the first polymer and the second polymer to the substructure, said sidewall comprising a first material, a selective chemical affinity of the first polymer for the first material being greater than a selective chemical affinity of the second polymer for the first material; and
segregating the first polymer from the second polymer, said first polymer selectively segregating to the sidewall resulting in the first polymer being disposed between the sidewall and the second polymer to form the structural configuration.

21. A method for processing structures, said method comprising:
forming a structural configuration, said structural configuration comprising a substrate, a substructure having a sidewall and disposed on an external surface of the substrate, a first polymer structure disposed on the external surface of the substrate and in direct mechanical contact with the sidewall, and a second polymer structure disposed on the external surface of the substrate and in direct mechanical contact with the first polymer structure such that the first polymer structure is disposed between the sidewall and the second polymer structure, said first polymer structure comprising a first polymer, said second polymer structure comprising a second polymer;
reducing an aspect ratio of the first polymer structure with respect to the external surface of the substrate, said reducing comprising removing an upper portion furthest from the substrate of the first polymer structure;
totally removing the second polymer structure from the structural configuration such that the first polymer structure remains disposed on the external surface of the substrate after the second polymer structure has been totally removed;
totally removing the substructure such that the first polymer structure remains disposed on the external surface of the substrate after the substructure has been totally removed,
wherein said reducing the aspect ratio of the first polymer structure is performed before said totally removing the second polymer structure is performed and before said totally removing the substructure is performed, and
wherein said totally removing the substructure is performed before said totally removing the second polymer structure is performed;
wherein the structural configuration, after being formed and before said reducing the aspect ratio of the first polymer structure is initiated, further comprises a third polymer structure disposed on the external surface of the substrate, wherein the second polymer structure is disposed between, and in direct physical contact with, both the first polymer structure and the third polymer structure, and wherein the third polymer structure comprises the first polymer, and
wherein the method further comprises:
reducing an aspect ratio of the third polymer structure with respect to the external surface of the substrate which comprises removing an upper portion furthest from the substrate of the third polymer structure, wherein said reducing the aspect ratio of the first polymer structure and said reducing the aspect ratio of the third polymer structure are performed simultaneously.

22. The method of claim 21, wherein the structural configuration, after being formed and before said reducing the aspect ratio of the first polymer structure is initiated, is characterized by the substructure, the first polymer structure, and the second polymer structure each being directly exposed to an ambient environment.

* * * * *